(12) United States Patent
Kim et al.

(10) Patent No.: US 10,991,825 B2
(45) Date of Patent: Apr. 27, 2021

(54) SEMICONDUCTOR DEVICE INCLUDING NON-ACTIVE FINS AND SEPARATION REGIONS

(71) Applicant: Samsung Electronics Co., Ltd., Suwon-si (KR)

(72) Inventors: Cheol Kim, Hwaseong-si (KR); Jong Chui Park, Hwaseong-si (KR); Kye Hyun Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 73 days.

(21) Appl. No.: 16/167,815

(22) Filed: Oct. 23, 2018

(65) Prior Publication Data

US 2019/0288114 A1     Sep. 19, 2019

(30) Foreign Application Priority Data

Mar. 14, 2018    (KR) ........................ 10-2018-0029712

(51) Int. Cl.
| | |
|---|---|
| *H01L 29/76* | (2006.01) |
| *H01L 29/78* | (2006.01) |
| *H01L 29/66* | (2006.01) |
| *H01L 29/08* | (2006.01) |
| *H01L 29/423* | (2006.01) |
| *H01L 29/417* | (2006.01) |
| *H01L 21/8238* | (2006.01) |
| *H01L 27/092* | (2006.01) |

(52) U.S. Cl.
CPC .. *H01L 29/7851* (2013.01); *H01L 21/823821* (2013.01); *H01L 27/0924* (2013.01); *H01L 29/0865* (2013.01); *H01L 29/0882* (2013.01); *H01L 29/41791* (2013.01); *H01L 29/42356* (2013.01); *H01L 29/6681* (2013.01); *H01L 29/66795* (2013.01); *H01L 29/66818* (2013.01); *H01L 29/7854* (2013.01)

(58) Field of Classification Search
None
See application file for complete search history.

(56) References Cited

U.S. PATENT DOCUMENTS

| | | | |
|---|---|---|---|
| 9,012,287 B2 | 4/2015 | Liaw | |
| 9,178,019 B2 | 11/2015 | Cheng et al. | |
| 9,425,201 B2 | 8/2016 | Liaw | |
| 9,455,176 B2 | 9/2016 | Tsao et al. | |
| 9,472,672 B2 * | 10/2016 | Lin | ................. H01L 21/823821 |
| 9,564,438 B2 | 2/2017 | Kanakasabapathy | |
| 9,659,810 B2 | 5/2017 | Yin et al. | |
| 9,735,156 B1 | 8/2017 | Cha | |
| 9,799,771 B2 | 10/2017 | Cheng et al. | |
| 9,805,984 B2 | 10/2017 | Yin et al. | |
| 9,853,131 B1 * | 12/2017 | Cheng | ............. H01L 21/823418 |
| 2017/0338225 A1 | 11/2017 | Ching et al. | |
| 2018/0040618 A1 * | 2/2018 | Lee | ....................... H01L 21/845 |

\* cited by examiner

*Primary Examiner* — Hung K Vu
(74) *Attorney, Agent, or Firm* — Sughrue Mion, PLLC

(57) ABSTRACT

A semiconductor device includes a substrate having a plurality of fins protruding therefrom. The plurality of fins includes a plurality of active fins and at least one non-active fin disposed between ones of the plurality of active fins. The device also includes at least one gate electrode crossing at least a portion of the active fins. The device further includes a plurality of source/drain regions disposed on the active fins adjacent the at least one gate electrode and separated from one another by the at least one non-active fin.

20 Claims, 22 Drawing Sheets

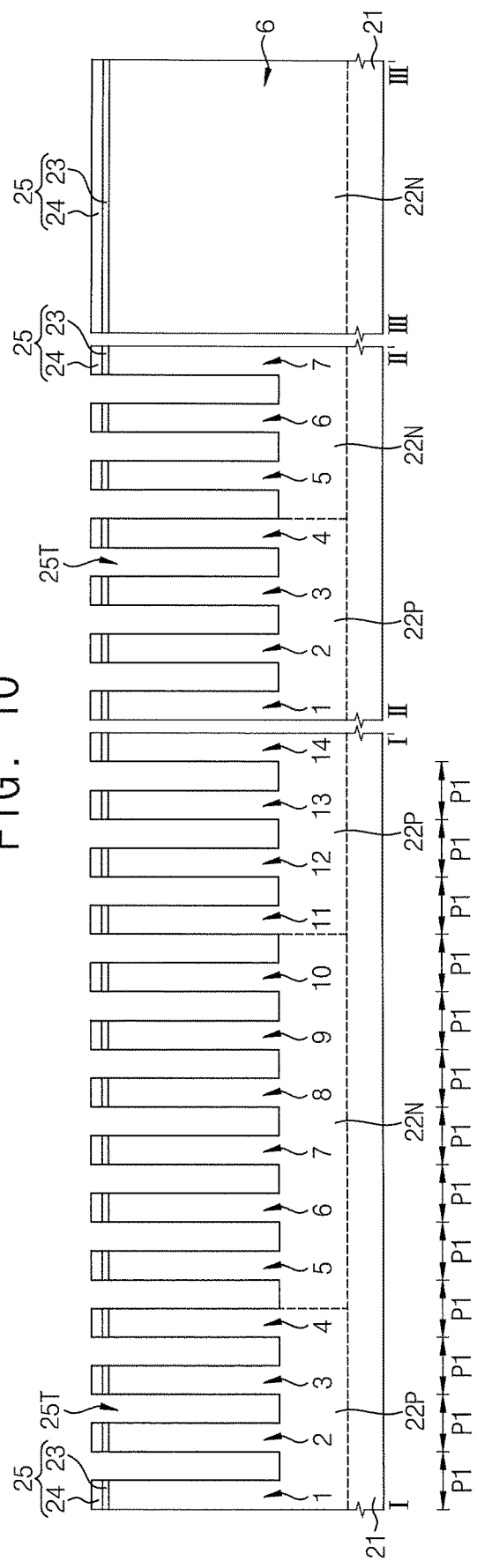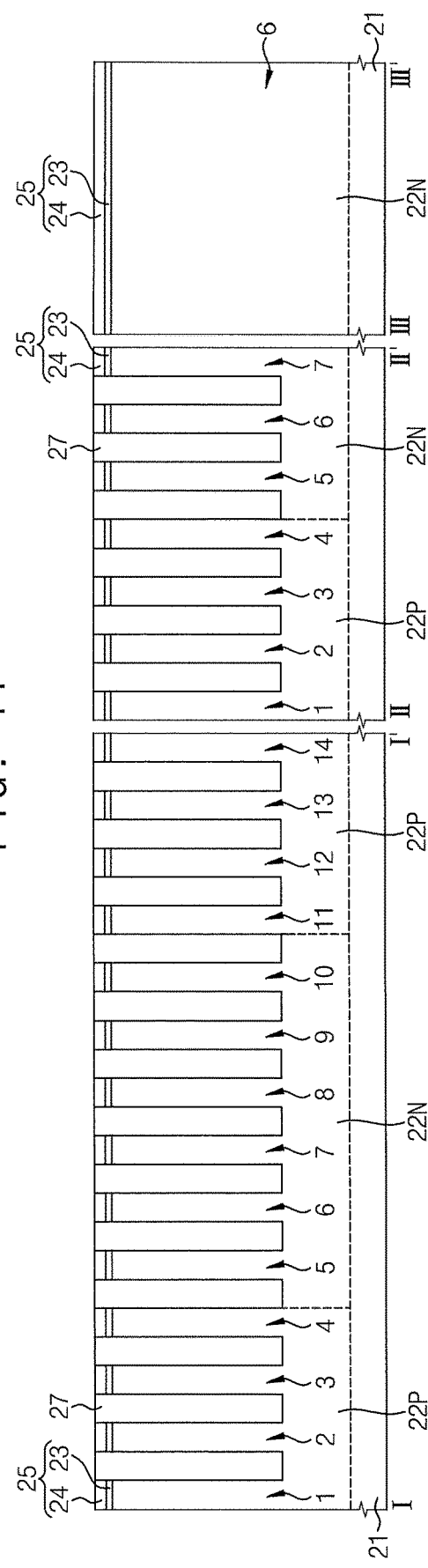

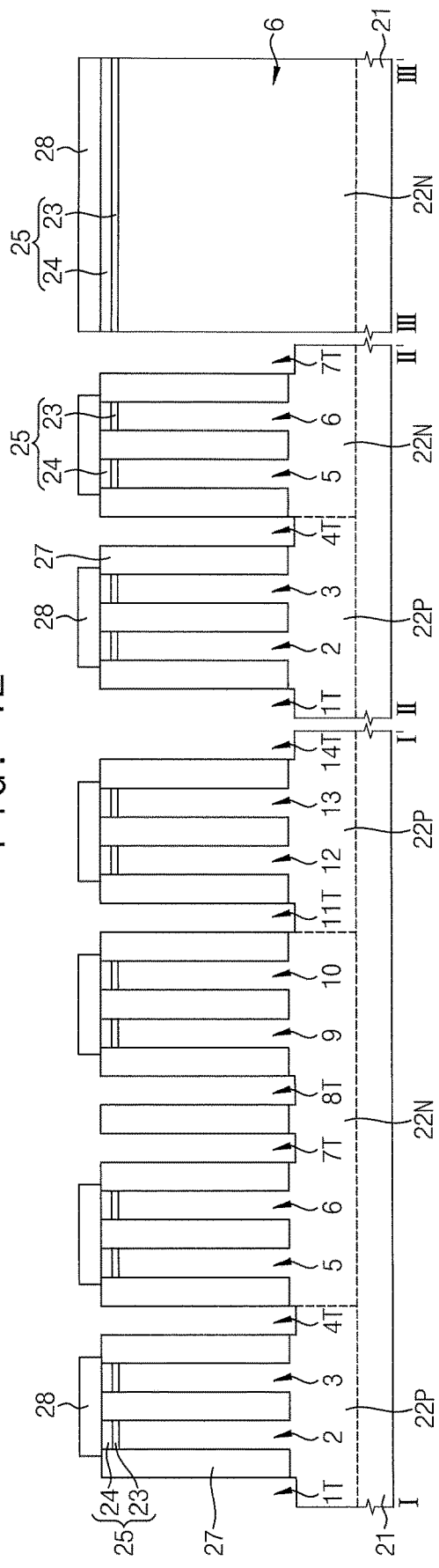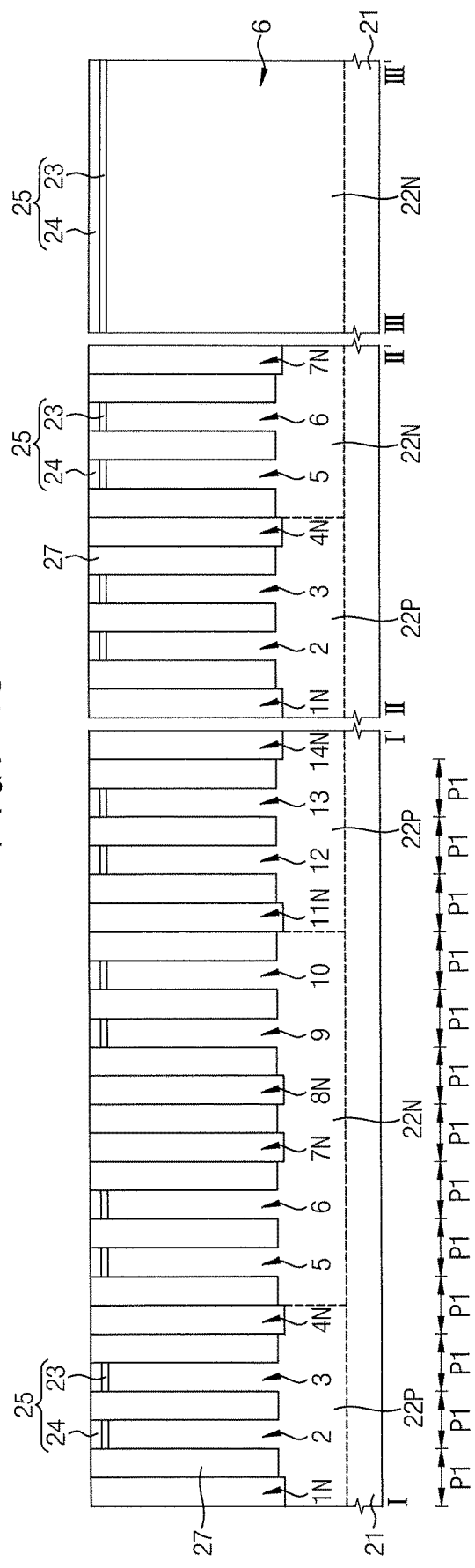

SEMICONDUCTOR DEVICE INCLUDING NON-ACTIVE FINS AND SEPARATION REGIONS

CROSS-REFERENCE TO THE RELATED APPLICATION

This U.S. non-provisional patent application claims priority under 35 U.S.C. § 119 to and the benefit of Korean Patent Application No. 10-2018-0029712, filed on Mar. 14, 2018, in the Korean Intellectual Property Office (KIPO), the disclosure of which is incorporated herein by reference in its entirety.

BACKGROUND

1. Field

Apparatus and methods consistent with exemplary embodiments relate to semiconductor devices including a non-active fin between active fins and methods of manufacturing the same.

2. Discussion of Related Art

Research into techniques for realizing CMOS devices using FinFET structures is ongoing. In some devices, a plurality of active fins spaced at various intervals may be disposed in a substrate. A plurality of gate electrodes cross the active fins and a plurality of source/drain regions are disposed adjacent to the gate electrodes. Processes for forming the source/drain regions and separating the gate electrodes may produce various problems, such as undesirable leakage current.

SUMMARY OF THE INVENTION

Some embodiments of the inventive concept can provide a semiconductor device having a low leakage current and desirable operating characteristics. Some embodiments provide methods of manufacturing semiconductor devices having a low leakage current and desirable operating characteristics.

According to some exemplary embodiments, a semiconductor device includes a substrate having a plurality of fins protruding therefrom. The plurality of fins includes a plurality of active fins and at least one non-active fin disposed between ones of the plurality of active fins. The device also includes at least one gate electrode crossing at least a portion of the active fins. The device further includes a plurality of source/drain regions disposed on the active fins adjacent the at least one gate electrode and separated from one another by the at least one non-active fin.

Further embodiments provide a semiconductor device including a substrate having a P-well and an N-well therein. A P-type active fin is disposed in the P-well and an N-type active fin disposed in the N-well. A first gate electrode crosses the N-type active fin and a second gate electrode crosses the P-type active fin. A first source/drain region is disposed on the N-type active fin and a second source/drain region is disposed on the P-type active fin. At least one non-active fin is disposed between the P-type active fin and the N-type active fin and between the first source/drain region and the second source/drain region.

Still further embodiments provide a semiconductor device including a first active fin disposed in a substrate and a second active fin disposed in the substrate and spaced apart from the first active fin. A non-active fin is disposed between the first active fin and the second active fin. A first gate electrode crosses the first active fin and second gate electrode crosses the second active fin. A gate separating pattern is disposed on the non-active fin between the first gate electrode and the second gate electrode.

BRIEF DESCRIPTION OF THE DRAWINGS

FIGS. 10-30 are cross-sectional views illustrating operations for manufacturing semiconductor devices according to some embodiments.

DETAILED DESCRIPTION OF EXEMPLARY EMBODIMENTS

Figure 1:
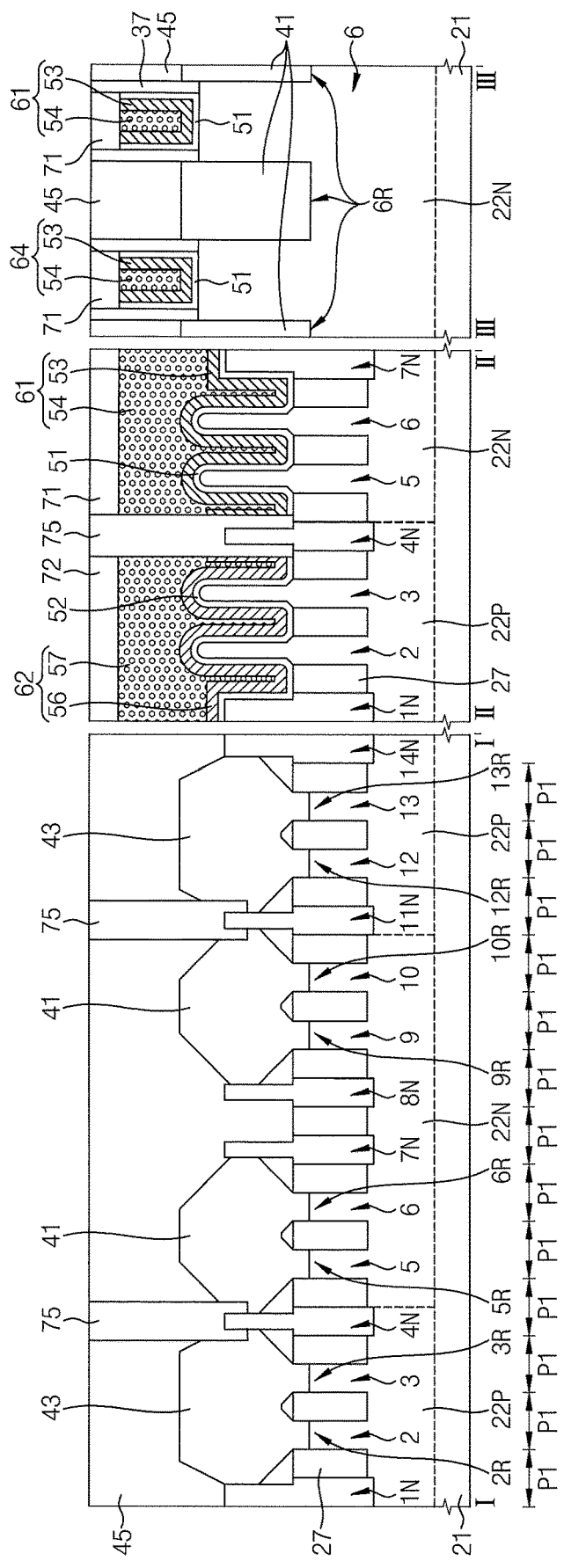
FIG. 1 is a cross-sectional view illustrating a semiconductor device according to some exemplary embodiment.
Figure 2:
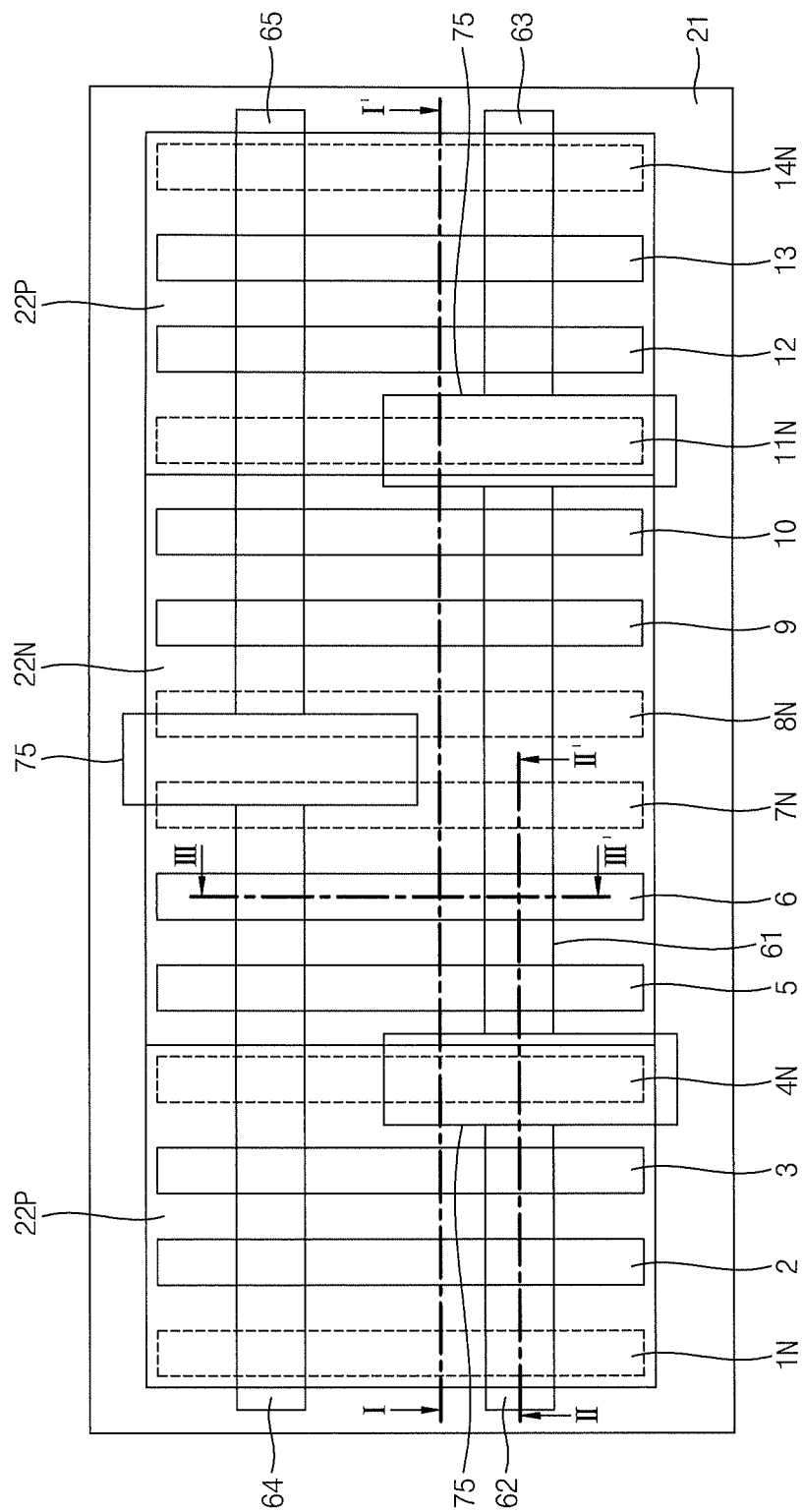
FIG. 2 is a layout illustrating a semiconductor device according to some embodiments.

FIG. 1 is a cross-sectional view illustrating a semiconductor device according to some exemplary embodiments taken along lines I-I', II-II', and III-III' shown in a layout of FIG. 2. FIGS. 3-6 are enlarged views illustrating a portion of FIG. 1, in detail.

Referring to FIG. 1, the semiconductor device may include a substrate 21, a P-well 22P, an N-well 22N, a plurality of fins 1N, 2, 3, 4N, 5, 6, 7N, 8N, 9, 10, 11N, 12, 13, and 14N, a device separating layer 27, a spacer layer 37, a plurality of recesses 2R, 3R, 5R, 6R, 9R, 10R, 12R, and 13R, a plurality of source/drain regions 41 and 43, an interlayer insulating layer 45, gate dielectric layers 51 and 52, a plurality of gate electrodes 61, 62, and 64, gate capping layers 71 and 72, and a plurality of gate separating patterns 75.

The plurality of fins 1N, 2, 3, 4N, 5, 6, 7N, 8N, 9, 10, 11N, 12, 13, and 14N may be classified into a plurality of non-active fins 1N, 4N, 7N, 8N, 11N, and 14N, and a plurality of active fins 2, 3, 5, 6, 9, 10, 12, and 13. The plurality of fins 1N, 2, 3, 4N, 5, 6, 7N, 8N, 9, 10, 11N, 12, 13, and 14N may include a first non-active fin 1N, a second active fin 2, a third active fin 3, a fourth non-active fin 4N, a fifth active fin 5, a sixth active fin 6, a seventh non-active fin 7N, an eighth non-active fin 8N, a ninth active fin 9, a tenth active fin 10, an eleventh non-active fin 11N, a twelfth active fin 12, a thirteenth active fin 13, and a fourteenth non-active fin 14N. The plurality of recesses 2R, 3R, 5R, 6R, 9R, 10R, 12R, and 13R may include a plurality of first recesses 5R, 6R, 9R, and 10R, and a plurality of second recesses 2R, 3R, 12R, and 13R. The plurality of source/drain regions 41 and 43 may include a plurality of first source/drain regions 41 and a plurality of second source/drain regions 43.

Referring to FIG. 2, the semiconductor device may include a substrate 21, a P-well 22P, an N-well 22N, a plurality of fins 1N, 2, 3, 4N, 5, 6, 7N, 8N, 9, 10, 11N, 12, 13, and 14N, a plurality of gate electrodes 61, 62, 63, 64, and 65, and a plurality of gate separating patterns 75. The plurality of gate electrodes 61, 62, 63, 64, and 65 may include a first gate electrode 61, a second gate electrode 62, a third gate electrode 63, and a fourth gate electrode 64, and a fifth gate electrode 65.

Referring to FIGS. 1 and 2, each of the first gate electrode 61 and the fourth gate electrode 64 may include a first work-function conductive layer 53 and a first conductive layer 54. The second gate electrode 62 may include a second work-function conductive layer 56 and a second conductive layer 57. The first work-function conductive layer 53 may include a PMOS work-function metal, and the second work-function conductive layer 56 may include a NMOS work-function metal. Each of the first work-function conductive layer 53 and the second work-function conductive layer 56 may have a multi-layered structure.

The plurality of fins 1N, 2, 3, 4N, 5, 6, 7N, 8N, 9, 10, 11N, 12, 13, and 14N may be sequentially arranged in parallel in 2-dimensional arrangements. Each of the fins 1N, 2, 3, 4N, 5, 6, 7N, 8N, 9, 10, 11N, 12, 13, and 14N may have substantially the same lateral width. Intervals between the fins 1N, 2, 3, 4N, 5, 6, 7N, 8N, 9, 10, 11N, 12, 13, and 14N may be substantially the same. The plurality of fins 1N, 2, 3, 4N, 5, 6, 7N, 8N, 9, 10, 11N, 12, 13, and 14N may have substantially the same pitch P1. Each of the non-active fins 1N, 4N, 7N, 8N, 11N, and 14N may have substantially the same lateral width as each of the active fins 2, 3, 5, 6, 9, 10, 12, and 13.

In some embodiments, the second active fin 2 and the third active fin 3 may be interposed between the first non-active fin 1N and the fourth non-active fin 4N, the fifth active fin 5 and the sixth active fin 6 may be interposed between the fourth non-active fin 4N and the seventh non-active fin 7N, the ninth active fin 9 and the tenth active fin 10 may be interposed between the eighth non-active fin 8N and the eleventh non-active fin 11N, and the twelfth active fin 12 and the thirteenth active fin 13 may be interposed between the eleventh non active fin 11N and the fourteenth non-active fin 14N. The fourth non-active fin 4N may be interposed between the third active fin 3 and the fifth active fin 5, the seventh non-active fin 7N and the eighth non-active fin 8N may be interposed between the sixth active fin 6 and the ninth active fin 9, and the eleventh non-active fin 11N may be interposed between the tenth active fin 10 and the twelfth active fin 12.

The first non-active fin 1N, the second active fin 2, the third active fin 3, the fourth non-active fin 4N, the eleventh non-active fin 11N, the twelfth active fin 12, the thirteenth active fin 13, and the fourteenth non-active fin 14N may be disposed in the P-well 22P. Each of the second active fin 2, the third active fin 3, the twelfth active fin 12, and the thirteenth active fin 13 may be a P-type active fin. The fifth active fin 5, the sixth active fin 6, the seventh non-active fin 7N, the eighth non-active fin 8N, the ninth active fin 9, and the tenth active fin 10 may be disposed in the N-well 22N. Each of the fifth active fin 5, the sixth active fin 6, the ninth active fin 9, and the tenth active fin 10 may be an N-type active fin. Each of the fourth non-active fin 4N and the eleventh non-active fin 11N may be disposed adjacent to an interface between the P-well 22P and the N-well 22N.

The device separating layer 27 may be disposed between the plurality of fins 1N, 2, 3, 4N, 5, 6, 7N, 8N, 9, 10, 11N, 12, 13, and 14N. The plurality of non-active fins 1N, 4N, 7N, 8N, 11N, and 14N may include a different material from the device separating layer 27 and/or the plurality of active fins 2, 3, 5, 6, 9, 10, 12, and 13. Lower ends of the plurality of non-active fins 1N, 4N, 7N, 8N, 11N, and 14N may be disposed at a level lower than that of a lower surface of the device separating layer 27. Each of the uppermost ends of the plurality of non-active fins 1N, 4N, 7N, 8N, 11N, and 14N may be disposed at a level lower than that of the uppermost end of one adjacent thereto among the plurality of active fins 2, 3, 5, 6, 9, 10, 12, and 13.

Each of the plurality of gate electrodes 61, 62, 63, 64, and 65 may cross at least one of the fins 1N, 2, 3, 4N, 5, 6, 7N, 8N, 9, 10, 11N, 12, 13, and 14N. The first gate electrode 61, the second gate electrode 62, and the third gate electrode 63 may be collinear. The first gate electrode 61 may cross the fifth active fin 5, the sixth active fin 6, the seventh non-active fin 7N, the eighth non-active fin 8N, the ninth active fin 9, and the tenth active fin 10. The first gate electrode 61 may extend between the fifth active fin 5, the sixth active fin 6, the seventh non-active fin 7N, the eighth non-active fin 8N, the ninth active fin 9, and the tenth active fin 10. The lowermost end of the first gate electrode 61 may be disposed at a level lower than that of upper ends of the fifth active fin 5, the sixth active fin 6, the seventh non-active fin 7N, the eighth non-active fin 8N, the ninth active fin 9, and the tenth active fin 10.

The second gate electrode 62 may cross the first non-active fin 1N, the second active fin 2, and the third active fin 3. The second gate electrode 62 may extend between the first non-active fin 1N, the second active fin 2, and the third active fin 3. The lowermost end of the second gate electrode 62 may be disposed at a level lower than that of upper ends of the first non-active fin 1N, the second active fin 2, and the third active fin 3.

The plurality of recesses 2R, 3R, 5R, 6R, 9R, 10R, 12R, and 13R may be formed in the plurality of active fins 2, 3, 5, 6, 9, 10, 12, and 13 adjacent to the plurality of gate electrodes 61, 62, 63, 64, and 65. The plurality of source/drain regions 41 and 43 may be disposed in the plurality of recesses 2R, 3R, 5R, 6R, 9R, 10R, 12R, and 13R. The plurality of first recesses 5R, 6R, 9R, and 10R may be formed in the fifth active fin 5, the sixth active fin 6, the ninth active fin 9, and the tenth active fin 10. The plurality of second recesses 2R, 3R, 12R, and 13R may be formed in the second active fin 2, the third active fin 3, the twelfth active fin 12, and the thirteenth active fin 13. The plurality of first source/drain regions 41 may be disposed in the plurality of first recesses 5R, 6R, 9R, and 10R, and the plurality of second source/drain regions 43 may be disposed in the plurality of second recesses 2R, 3R, 12R, and 13R.

The lowermost end of each of the plurality of source/drain regions 41 and 43 may be disposed at a level lower than that of an upper surface of an adjacent portion of the device separating layer 27. The upper ends of each of the plurality of non-active fins 1N, 4N, 7N, 8N, 11N, and 14N may protrude to a level higher than that of the upper surface of the adjacent portion of the device separating layer 27. The uppermost end of each of the non-active fins 1N, 4N, 7N, 8N, 11N, and 14N may protrude to a level higher than that of the lowermost end of one adjacent thereto of the plurality of source/drain regions 41 and 43. Each of the plurality of source/drain regions 41 and 43 may have a shape, in which a lateral width of a central region thereof is greater than a lateral width of an upper region and a lower region thereof. At least some of the plurality of non-active fins 1N, 4N, 7N, 8N, 11N, and 14N may be interposed between the plurality of source/drain regions 41 and 43. Side surfaces of the plurality of source/drain regions 41 and 43 may be in direct contact with side surfaces of the plurality of non-active fins 1N, 4N, 7N, 8N, 11N, and 14N. The uppermost end of each of the plurality of source/drain regions 41 and 43 may protrude to a level higher than that of the uppermost end of one adjacent thereto among the plurality of fins 1N, 2, 3, 4N, 5, 6, 7N, 8N, 9, 10, 11N, 12, 13, and 14N.

The gate separating patterns 75 may be interposed between the plurality of gate electrodes 61, 62, 63, 64, and 65. Each of the plurality of gate separating patterns 75 may be arranged on at least one, which corresponds thereto, among the plurality of non-active fins 1N, 4N, 7N, 8N, 11N, and 14N. Each of the gate separating patterns 75 may be in direct contact with side surfaces of the plurality of gate electrodes 61, 62, 63, 64, and 65. A lower end of each of the plurality of gate separating patterns 75 may be disposed at a level lower than that of at least one upper end, which corresponds thereto, among the plurality of non-active fins 1N, 4N, 7N, 8N, 11N, and 14N. Each of the plurality of gate separating patterns 75 may be in direct contact with at least one upper surface and a side surface, which corresponds thereto, among the plurality of non-active fins 1N, 4N, 7N, 8N, 11N, and 14N. The lower surfaces of the plurality of gate separating patterns 75 may be in direct contact with the device separating layer 27, the plurality of source/drain regions 41 and 43, or the plurality of non-active fins 1N, 4N, 7N, 8N, 11N, and 14N. The plurality of gate separating patterns 75 may protrude to a level higher than that of upper surfaces of the plurality of gate electrodes 61, 62, 63, 64, and 65.

In some embodiments, one selected from the plurality of gate separating patterns 75 may be interposed between the first gate electrode 61 and the second gate electrode 62. The selected one of the gate separating patterns 75 may completely cross the first gate electrode 61 and the second gate electrode 62. Each of the side surfaces of the first gate electrode 61 and the second gate electrode 62 may be in contact with one of both side surfaces of one selected from the plurality of gate separating patterns 75. The selected one among the plurality of gate separating patterns 75 may be-disposed on the fourth non-active fin 4N. The upper end of the fourth non-active fin 4N may protrude to a level higher than that of the lower ends of the first gate electrode 61 and the second gate electrode 62. The lowermost end of the one selected from the plurality of gate separating patterns 75 may be disposed at a level lower than that of an upper end of the fourth non-active fin 4N. The one selected from the plurality of gate separating patterns 75 may be in direct contact with the upper surface and the side surface of the fourth non-active fin 4N. In some embodiments, the fourth non-active fin 4N may be a non-active fin. The one selected from the gate separating pattern 75 and the fourth non-active fin 4N may serve to block a leakage current from being generated between the first gate electrode 61 and the second gate electrode 62.

In some embodiments, the third active fin 3 may be disposed in the P-well 22P. The third active fin 3 may be a P-type active fin. The fifth active fin 5 may be disposed in the N-well 22N. The fifth active fin 5 may be an N-type active fin. The fourth non-active fin 4N may be interposed between the third active fin 3 and the fifth active fin 5. The fourth non-active fin 4N may be disposed adjacent to an interface between the P-well 22P and the N-well 22N. The fourth non-active fin 4N may be referred to as a first non-active fin. The first gate electrode 61 may cross the fifth active fin 5. The second gate electrode 62 may cross the third active fin 3. One selected from the plurality of first source/drain regions 41 may be disposed on a corresponding one among the plurality of first recesses 5R, 6R, 9R, and 10R formed in the fifth active fin 5. The one selected from the plurality of second source/drain regions 43 may be disposed on a corresponding one among the plurality of second recesses 2R, 3R, 12R, and 13R. The fourth non-active fin 4N may be interposed between one selected from the plurality of first source/drain regions 41 and one selected from the plurality of second source/drain regions 43. The seventh non-active fin 7N may be disposed in the N-well 22N. The fifth active fin 5 may be interposed between the fourth non-active fin 4N and the seventh non-active fin 7N. In some embodiments, the seventh non-active fin 7N may be referred to as a second non-active fin. An upper end of the seventh non-active fin 7N may be disposed at a level higher than that of the upper surface in an adjacent region of the device separating layer 27.

In some embodiments, the fifth active fin 5 may be referred to as a first active fin, and the third active fin 3 may be referred to as a second active fin. The fourth non-active fin 4N may be referred to as a non-active fin.

Figure 3:
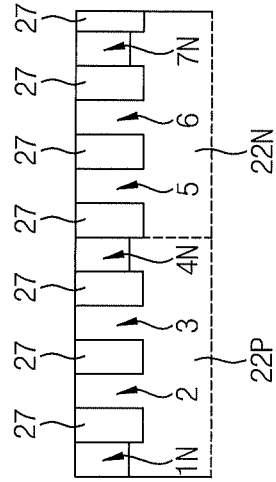
FIGS. 3-6 are enlarged views illustrating portions of the device of FIG. 1.

Referring to FIG. 3, the lower ends of the plurality of non-active fins 1N, 4N, and 7N may be disposed on substantially the same level as that of the lower ends of the device separating layer 27 adjacent thereto.

Figure 4:
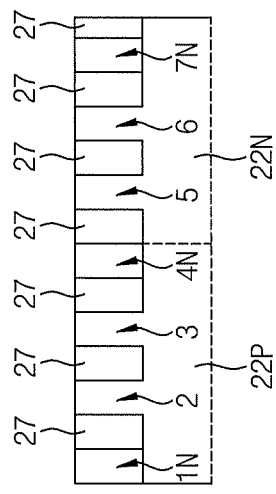

Referring to FIG. 4, the lower ends of the plurality of non-active fins 1N, 4N, and 7N may be disposed at a level higher than that of the lower ends of the device separating layer 27 adjacent thereto.

Figure 5:
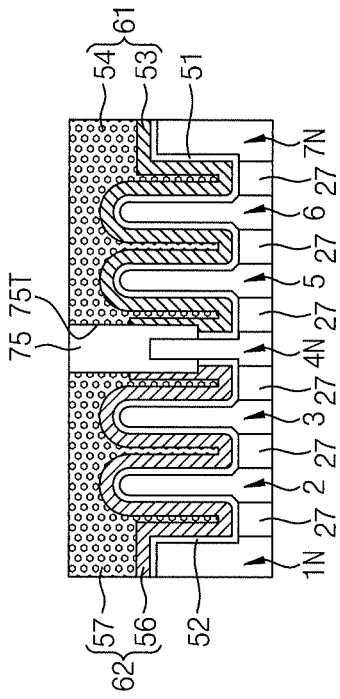

Referring to FIG. 5, etch byproducts 81 may remain on a bottom of a separation trench 75T. The etch byproducts 81 may be in contact with a lower surface of the gate separating pattern 75. The gate separating pattern 75 may be in direct contact with an upper surface and side surfaces of the fourth non-active fin 4N. The gate separating pattern 75 and the fourth non-active fin 4N may electrically separate the second gate electrode 62 from the first gate electrode 61. Although the etch byproducts 81 remain, the gate separating pattern 75 and the fourth non-active fin 4N may completely block a leakage current from being generated between the first gate electrode 61 and the second gate electrode 62.

Figure 6:
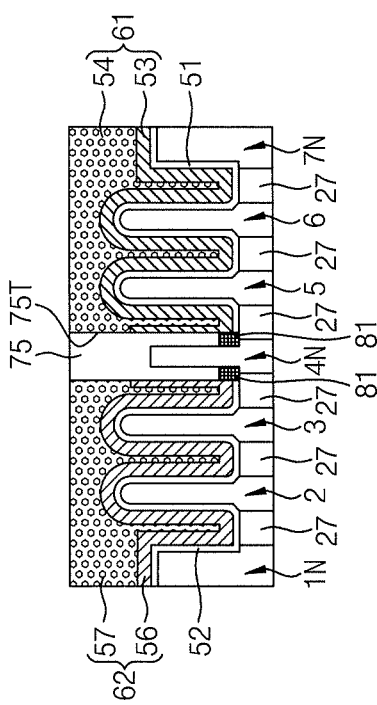

Referring to FIG. 6, the lowermost end of the separation trench 75T may be disposed at a level higher than that of the lowermost end of the plurality of gate electrodes 61 and 62. The plurality of gate electrodes 61 and 62 may partially remain on a bottom of the separation trench 75T. The lower surface of the gate separating pattern 75 may be in contact with the plurality of gate electrodes 61 and 62. The plurality of gate electrodes 61 and 62 may partially extend to a lower portion of the gate separating pattern 75.

Figure 7:
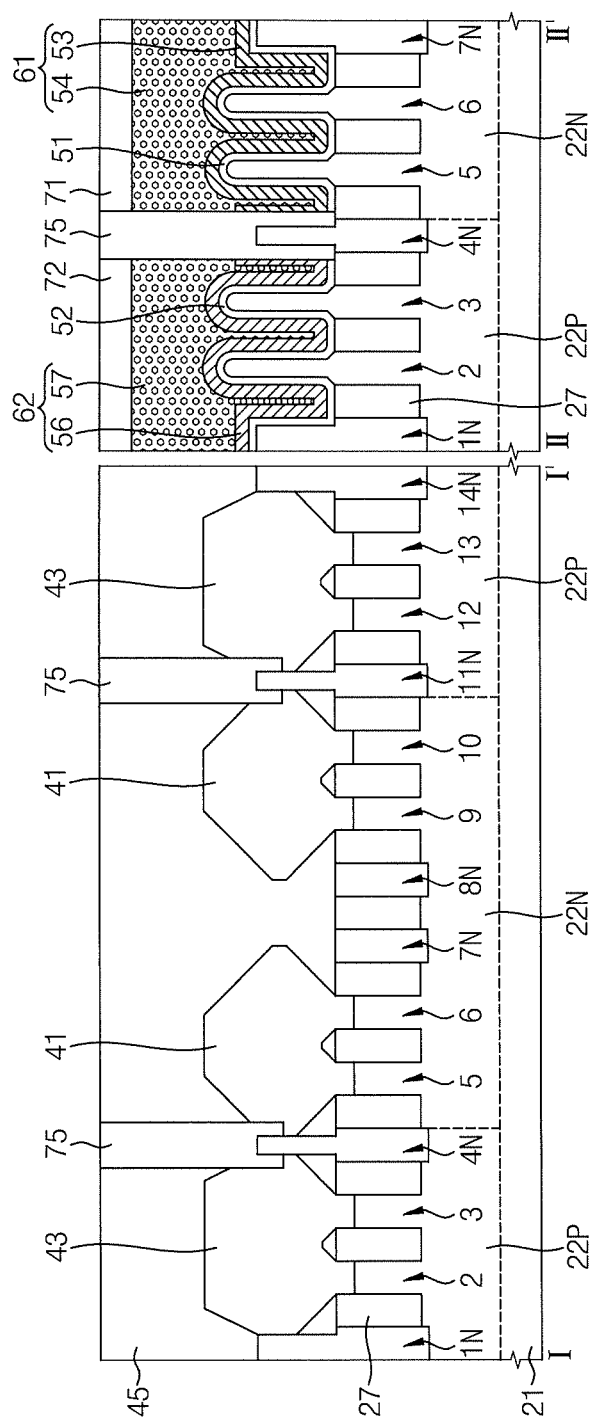
FIGS. 7-9 are cross-sectional views illustrating semiconductor devices according to further embodiments.
Figure 8:
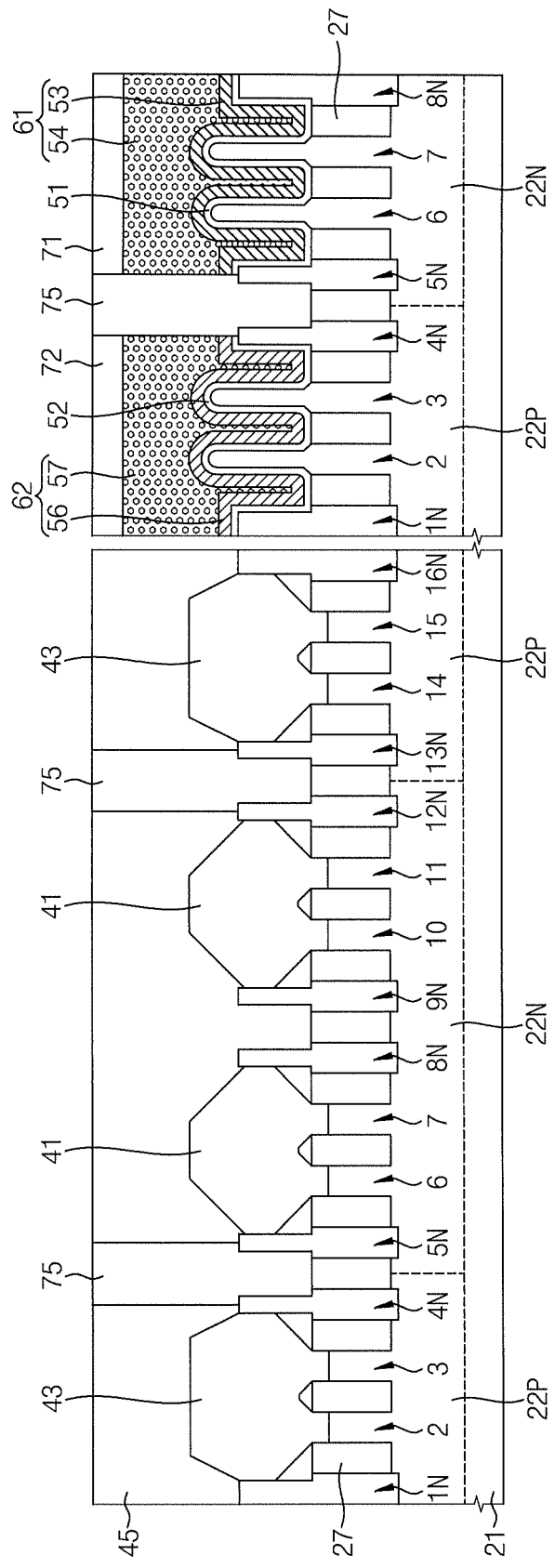
Figure 9:
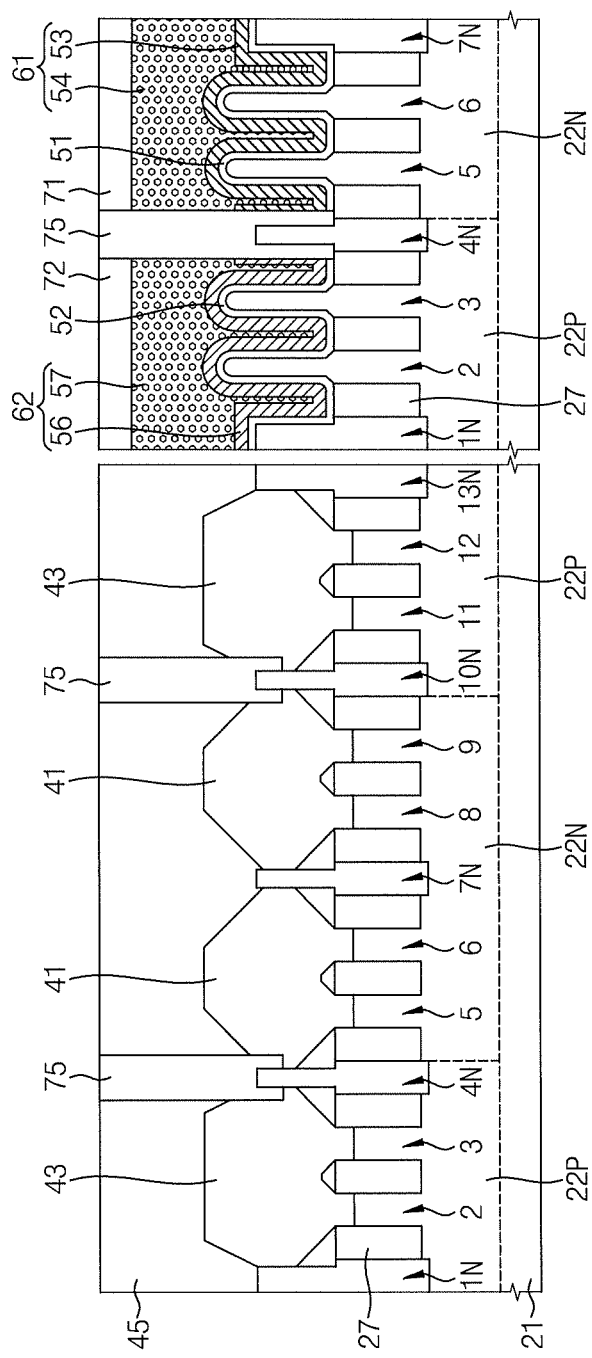

FIGS. 7 to 9 are cross-sectional views illustrating a semiconductor device according to some embodiments. Referring to FIG. 7, upper surfaces of an seventh non-active fin 7N and an eighth non-active fin 8N may be disposed at a level lower than that of upper surfaces of an fourth non-active fin 4N and an eleventh non-active fin 11N which are adjacent thereto. The upper surfaces of the seventh non-active fin 7N and the eighth non-active fin 8N may be disposed at substantially the same level as an upper surface of an adjacent region of a device separating layer 27. In some embodiments, the fourth non-active fin 4N may be referred to as a first non-active fin, and the seventh non-active fin 7N may be referred to as a second non-active fin. One side surfaces of a plurality of first source/drain regions 41 may partially overlap an upper portion of the seventh non-active fin 7N or the eighth non-active fin 8N.

Referring to FIG. 8, the semiconductor device may include a substrate 21, a P-well 22P, an N-well 22N, a plurality of fins 1N, 2, 3, 4N, 5N, 6, 7, 8N, 9N, 10, 11, 12N, 13N, 14, 15, and 16N, a device separating layer 27, a plurality of source/drain regions 41 and 43, an interlayer insulating layer 45, gate dielectric layers 51 and 52, a plurality of gate electrodes 61 and 62, gate capping layers 71 and 72, and a plurality of gate separating patterns 75.

The plurality of fins 1N, 2, 3, 4N, 5N, 6, 7, 8N, 9N, 10, 11, 12N, 13N, 14, 15, and 16N may be classified into a plurality of non-active fins 1N, 4N, 5N, 8N, 9N, 12N, 13N, and 16N, and a plurality of active fins 2, 3, 6, 7, 10, 11, 14, and 15. The plurality of fins 1N, 2, 3, 4N, 5N, 6, 7, 8N, 9N, 10, 11, 12N, 13N, 14, 15, and 16N may include a first non-active fin 1N, a second active fin 2, a third active fin 3, a fourth non-active fin 4N, a fifth non-active fin 5N, a sixth active fin 6, a seventh active fin 7, an eighth non-active fin 8N, a ninth non-active fin 9N, a tenth active fin 10, an eleventh active fin 11, a twelfth non-active fin 12N, a thirteenth non-active fin 13N, a fourteenth active fin 14, a fifteenth active fin 15, and a sixteenth non-active fin 16N. The fourth non-active fin 4N and the fifth non-active fin 5N may be interposed between the third active fin 3 and the sixth active fin 6, and the twelfth non-active fin 12N and the thirteenth non-active fin 13N may be interposed between the eleventh active fin 11 and the fourteenth active fin 14.

One of the gate separating patterns 75 may overlap the fourth non-active fin 4N and the fifth non-active fin 5N, and another one of the gate separating patterns 75 may overlap the twelfth non-active fin 12N and the thirteenth non-active fin 13N. One of the gate separating patterns 75 may extend between the fourth non-active fin 4N and the fifth non-active fin 5N, and another one of the gate separating patterns 75 may extend between the twelfth non-active fin 12N and the thirteenth non-active fin 13N. Lower surfaces of the gate separating patterns 75 may be disposed at a level lower than that of the upper surfaces of the fourth non-active fin 4N, the fifth non-active fin 5N, the twelfth non-active fin 12N, and the thirteenth non-active fin 13N. The plurality of gate separating patterns 75 may be in direct contact with the upper surfaces and side surfaces of the fourth non-active fin 4N, the fifth non-active fin 5N, the twelfth non-active fin 12N, and the thirteenth non-active fin 13N.

Referring to FIG. 9, the semiconductor device may include a substrate 21, a P-well 22P, an N-well 22N, a plurality of fins 1N, 2, 3, 4N, 5, 6, 7N, 8, 9, 10N, 11, 12, and 13N, a device separating layer 27, a plurality of source/drain regions 41 and 43, an interlayer insulating layer 45, gate dielectric layers 51 and 52, a plurality of gate electrodes 61 and 62, gate capping layers 71 and 72, and a plurality of gate separating patterns 75.

The plurality of fins 1N, 2, 3, 4N, 5, 6, 7N, 8, 9, 10N, 11, 12, and 13N may be classified into a plurality of non-active fins 1N, 4N, 7N, 10N, and 13N, and a plurality of active fins 2, 3, 5, 6, 8, 9, 11, and 12. The plurality of fins 1N, 2, 3, 4N, 5, 6, 7N, 8, 9, 10N, 11, 12, 13N may include a first non-active fin 1N, a second active fin 2, a third active fin 3, a fourth non-active fin 4N, a fifth active fin 5, a sixth active fin 6, a seventh non-active fin 7N, an eighth active fin 8, a ninth active fin 9, a tenth non-active fin 10N, an eleventh active fin 11, a twelfth active fin 12, and a thirteenth non-active fin 13N. The seventh non-active fin 7N may be interposed between the sixth active fin 6 and the eighth active fin 8.

FIGS. 10 to 24 illustrate operations for manufacturing a semiconductor device according to some embodiments. FIGS. 10 to 24 are cross-sectional views taken along lines I-I', and shown in FIG. 2.

Referring to FIGS. 2 and 10, a first mask pattern 25 may be formed on the substrate 21. The first mask pattern 25 may include a first buffer layer 23 formed on the substrate 21 and a first mask layer 24 formed on the first buffer layer 23. A plurality of first trenches 25T may be formed in the substrate 21 using the first mask pattern 25 as an etching mask. The plurality of first trenches 25T may define a plurality of active fins 1, 2, 3, 4, 5, 6, 7, 8, 9, 10, 11, 12, 13, and 14 in the substrate 21. The plurality of active fins 1, 2, 3, 4, 5, 6, 7, 8, 9, 10, 11, 12, 13, and 14 may include a first active fin 1, a second active fin 2, a third active fin 3, a fourth active fin 4, a fifth active fin 5, a sixth active fin 6, a seventh active fin 7, an eighth active fin 8, a ninth active fin 9, a tenth active fin 10, an eleventh active fin 11, a twelfth active fin 12, a thirteenth active fin 13, and a fourteenth active fin 14. The substrate 21 may include the P-well 22P and the N-well 22N. The first active fin 1, the second active fin 2, the third active fin 3, the fourth active fin 4, the eleventh active fin 11, the twelfth active fin 12, the thirteenth active fin 13, and the fourteenth active fin 14 may be defined in the P-well 22P. The fifth active fin 5, the sixth active fin 6, the seventh active fin 7, the eighth active fin 8, the ninth active fin 9, and the tenth active fin 10 may be defined in the N-well 22N.

The substrate 21 may include a semiconductor substrate such as a silicon wafer, a silicon-on-insulator (SOI) wafer, etc. For example, the substrate 21 may include a single crystalline silicon wafer having P-type impurities. The P-well 22P may be formed in the substrate 21 in which P-type impurities are implanted, and the N-well 22N may be formed in the substrate 21 in which N-type impurities are implanted. The P-type impurities may include boron (B), and the N-type impurities may include phosphorus (P), arsenic (As), or a combination thereof. The P-well 22P and the N-well 22N may have different depths, but hereinafter, for convenience of description, lower surfaces of the P-well 22P and the N-well 22N may have substantially the same level. In some embodiments, when the substrate 21 includes the single crystalline silicon wafer having P-type impurities, the P-well 22P may be omitted. The P-well 22P and the N-well 22N may alternately and repeatedly arranged in the substrate 21 in several two-dimensional arrangements.

The first buffer layer 23 may include an oxide such as silicon oxide. The first mask layer 24 may include a material having etching selectivity with respect to the substrate 21. The first mask layer 24 may include a nitride such as silicon nitride. The plurality of first trenches 25T may have a vertical height greater than a lateral width thereof. Each of the plurality of first trenches 25T may have substantially the same lateral width.

Each of the plurality of active fins 1, 2, 3, 4, 5, 6, 7, 8, 9, 10, 11, 12, 13, and 14 may have a vertical height greater than a lateral width thereof. Each of the active fins 1, 2, 3, 4, 5, 6, 7, 8, 9, 10, 11, 12, 13, and 14 may have substantially the same lateral width. Intervals between the plurality of active fins 1, 2, 3, 4, 5, 6, 7, 8, 9, 10, 11, 12, 13, and 14 may be substantially the same. The plurality of active fins 1, 2, 3, 4, 5, 6, 7, 8, 9, 10, 11, 12, 13, and 14 may have substantially the same pitch P1. Upper surfaces of the plurality of active fins 1, 2, 3, 4, 5, 6, 7, 8, 9, 10, 11, 12, 13, and 14 may be at substantially the same level.

In some embodiments, after a process of defining the plurality of active fins 1, 2, 3, 4, 5, 6, 7, 8, 9, 10, 11, 12, 13, and 14 is performed, the P-well 22P and the N-well 22N may be formed.

Referring to FIGS. 2 and 11, a device separating layer 27 may be formed in a plurality of first trenches 25T. The device separating layer 27 may include an insulating layer including silicon oxide, silicon nitride, silicon oxynitride, or a combination thereof. In some embodiments, the device separating layer 27 may include silicon oxide.

Referring to FIGS. 2 and 12, a second mask pattern 28 may be formed on the device separating layer 27 and the first mask pattern 25. Using the second mask pattern 28 as an etching mask, the first mask pattern 25 is selectively removed, and the first active fin 1, the fourth active fin 4, the seventh active fin 7, the eighth active fin 8, the eleventh active fin 11, and the fourteenth active fin 14 are removed, and thus, a plurality of second trenches 1T, 4T, 7T, 8T, 11T, and 14T are formed. The second mask pattern 28 may include a material having etching selectivity with respect to the substrate 21. Bottoms of the plurality of second trenches 1T, 4T, 7T, 8T, 11T, and 14T may be formed at a level lower than that of the lower surfaces of the device separating layer 27.

In some embodiments, the bottoms of the plurality of second trenches 1T, 4T, 7T, 8T, 11T, and 14T may be formed at substantially the same level as that of the lower surfaces of the device separating layer 27 adjacent thereto. The bottoms of the plurality of second trenches 1T, 4T, 7T, 8T, 11T, and 14T may be formed at a level higher than that of the lower surfaces of the device separating layer 27.

In some embodiments, the process of removing the first active fin 1, the fourth active fin 4, the seventh active fin 7, the eighth active fin 8, the eleventh active fin 11, and the fourteenth active fin 14 to form the plurality of second trenches 1T, 4T, 7T, 8T, 11T, and 14T may include an etching process using NF3, H2, or a combination thereof. The etching process may include a cyclic etching process having a breakthrough operation, a sidewall passivation operation, and an etching operation. The etching process may include a pulse plasma etching process. The sidewall passivation step may use oxygen (O2), CmHn, or a combination thereof (wherein m and n are positive integers). For example, the CmHn may include methane gas (CH4). The sidewall passivation operation may serve to prevent etch damage of the device separating layer 27. The sidewall passivation operation may serve to reduce profile attack of the plurality of second trenches 1T, 4T, 7T, 8T, 11T, and 14T.

In some embodiments, the process of removing the first active fin 1, the fourth active fin 4, the seventh active fin 7, the eighth active fin 8, the eleventh active fin 11, and the fourteenth active fin 14 to form the plurality of second trenches 1T, 4T, 7T, 8T, 11T, and 14T may include an etching process using Cl2, HBr, or a combination thereof.

Referring to FIGS. 2 and 13, the second mask pattern 28 is removed to leave the plurality of non-active fins 1N, 4N, 7N, 8N, 11N, and 14N in the plurality of second trenches 1T, 4T, 7T, 8T, 11T, and 14T. For convenience of description, the plurality of non-active fins 1N, 4N, 7N, 8N, 11N, and 14N are referred to as the first non-active fin 1N, the fourth non-active fin 4N, the seventh non-active fin 7N, the eighth non-active fin 8N, the eleventh non-active fin 11N, and the fourteenth non-active fin 14N. The first non-active fin 1N, the second active fin 2, the third active fin 3, the fourth non-active fin 4N, the fifth active fin 5, the sixth active fin 6, the seventh non-active fin 7N, the eighth non-active fin 8N, the ninth active fin 9, the tenth active fin 10, the eleventh non-active fin 11N, the twelfth active fin 12, the thirteenth active fin 13, and the fourteenth non-active fin 14N may be referred to as the plurality of fins 1N, 2, 3, 4N, 5, 6, 7N, 8N, 9, 10, 11N, 12, 13, and 14N.

The process of forming the plurality of non-active fins 1N, 4N, 7N, 8N, 11N, and 14N may include a thin film forming process and a planarizing process. The planarizing process may include a chemical mechanical polishing (CMP) process, an etch-back process, or a combination thereof. The plurality of non-active fins 1N, 4N, 7N, 8N, 11N, and 14N may include a material having etching selectivity with respect to the device separating layer 27. The plurality of non-active fins 1N, 4N, 7N, 8N, 11N, and 14N may include an insulating layer including silicon nitride, silicon oxide, SiC, SiOC, polysilicon, or a combination thereof. In some embodiments, the device separating layer 27 may include silicon oxide, the plurality of non-active fins 1N, 4N, 7N, 8N, 11N, and 14N may include silicon nitride. The lower ends of the plurality of non-active fins 1N, 4N, 7N, 8N, 11N, and 14N may be formed at a level lower than that of the lower surfaces of the device separating layer 27 adjacent thereto.

The plurality of non-active fins 1N, 4N, 7N, 8N, 11N, and 14N and the plurality of active fins 2, 3, 5, 6, 9, 10, 12, and 13 may have substantially the same lateral width. Intervals of the plurality of fins 1N, 2, 3, 4N, 5, 6, 7N, 8N, 9, 10, 11N, 12, 13, and 14N may be substantially the same. The plurality of fins 1N, 2, 3, 4N, 5, 6, 7N, 8N, 9, 10, 11N, 12, 13, and 14N may have substantially the same pitch P1.

Figure 14:
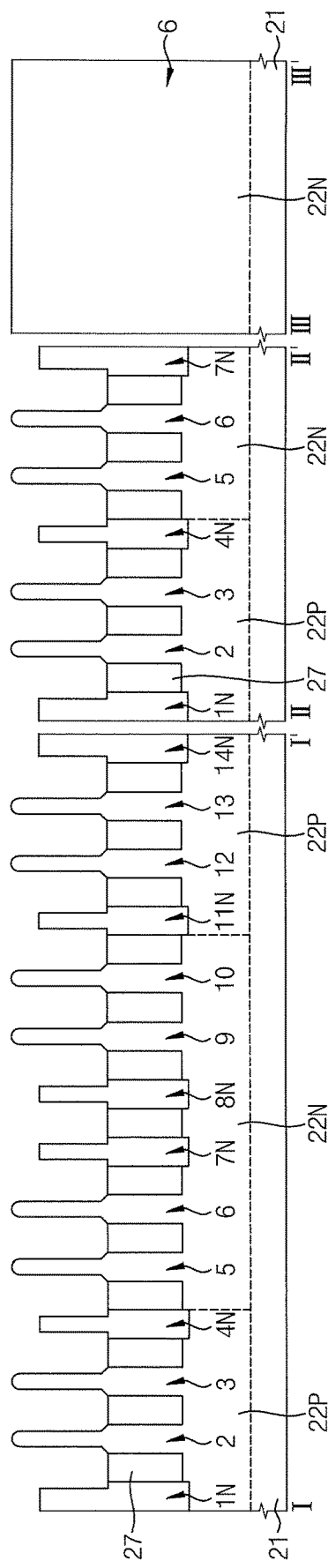

Referring to FIGS. 2 and 14, the first mask pattern 25 is removed and the device separating layer 27 is recessed, and thus, upper surfaces and side surfaces of the plurality of fins 1N, 2, 3, 4N, 5, 6, 7N, 8N, 9, 10, 11N, 12, 13, and 14N may be exposed. The upper surface of the device separating layer 27 may be formed at a level lower than that of the upper ends of the plurality of fins 1N, 2, 3, 4N, 5, 6, 7N, 8N, 9, 10, 11N, 12, 13, and 14N.

While the first mask pattern 25 is removed and the device separating layer 27 is recessed, the plurality of fins 1N, 2, 3, 4N, 5, 6, 7N, 8N, 9, 10, 11N, 12, 13, and 14N may be partially etched. Each of the plurality of fins 1N, 2, 3, 4N, 5, 6, 7N, 8N, 9, 10, 11N, 12, 13, and 14N may protrude to a level higher than that of the upper surface of the device separating layer 27 adjacent thereto. In each of the plurality of active fins 2, 3, 5, 6, 9, 10, 12, and 13, a lateral width of a portion protruding to a level higher than that of the upper surface of the device separating layer 27 may be decreased. Each of upper ends of the plurality of active fins 2, 3, 5, 6, 9, 10, 12, and 13 may have a round shape. The upper ends of the plurality of non-active fins 1N, 4N, 7N, 8N, 11N, and 14N may be formed at a level lower than that of the upper ends of the plurality of active fins 2, 3, 5, 6, 9, 10, 12, and 13. The plurality of non-active fins 1N, 4N, 7N, 8N, 11N, and 14N may serve to reduce a loading effect during the process of recessing the device separating layer 27. The upper surface of the device separating layer 27 may be formed at a very uniform level.

Figure 15:
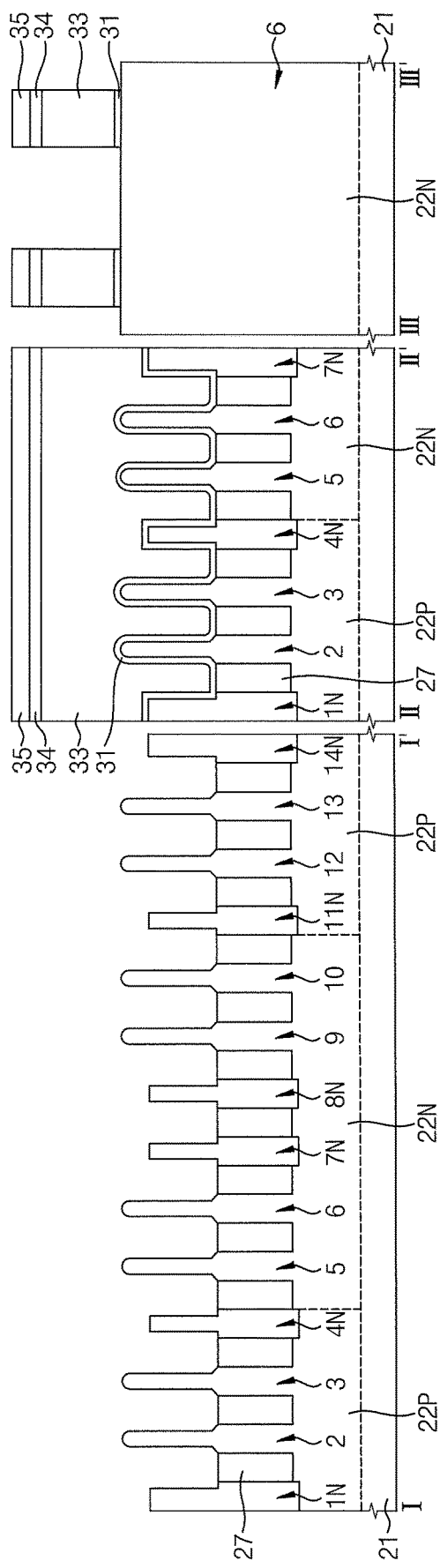

Referring to FIGS. 2 and 15, a plurality of sacrificial gate patterns 31, 33, 34, and 35 that cross the plurality of fins 1N, 2, 3, 4N, 5, 6, 7N, 8N, 9, 10, 11N, 12, 13, and 14N may be formed. Each of the plurality of sacrificial gate patterns 31, 33, 34, and 35 may include a second buffer layer 31, a temporary electrode 33, and a third buffer layer 34, and a third mask pattern 35. The process of forming the plurality of sacrificial gate patterns 31, 33, 34, and 35 may include a plurality of thin film forming processes and patterning processes.

The second buffer layer 31 may include an insulating layer, such as a silicon oxide layer. The temporary electrode 33 may include a semiconductor layer, such as a polysilicon layer. The third buffer layer 34 may include an insulating layer, such as a silicon oxide layer. The third mask pattern 35 may include an insulating layer, such as a silicon nitride layer. The plurality of sacrificial gate patterns 31, 33, 34, and 35 may cover the upper surfaces and the side surfaces of the plurality of fins 1N, 2, 3, 4N, 5, 6, 7N, 8N, 9, 10, 11N, 12, 13, and 14N.

Figure 16:
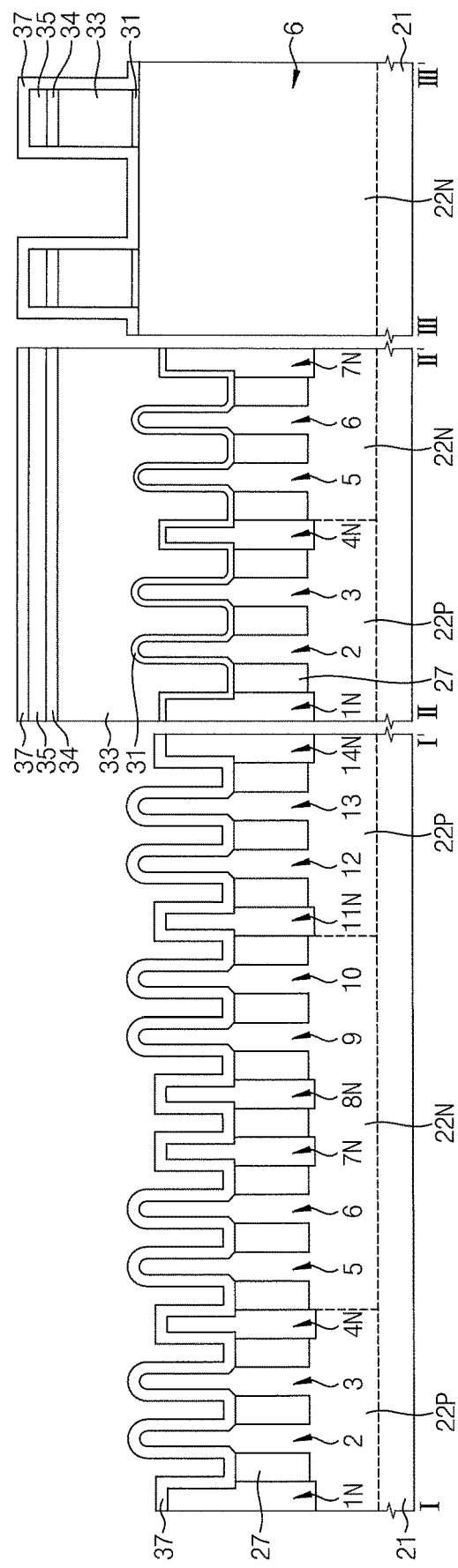

Referring to FIGS. 2 and 16, a spacer layer 37 may be formed to cover the plurality of fins 1N, 2, 3, 4N, 5, 6, 7N, 8N, 9, 10, 11N, 12, 13, and 14N and the plurality of sacrificial gate patterns 31, 33, 34, and 35. The spacer layer 37 may cover the side surfaces of the plurality of sacrificial gate patterns 31, 33, 34, and 35. The spacer layer 37 may include a material having an etching selectivity with respect to the device separating layer 27. In some embodiments, the spacer layer 37 may include a plurality of insulating layers. The spacer layer 37 may include silicon nitride.

Figure 17:
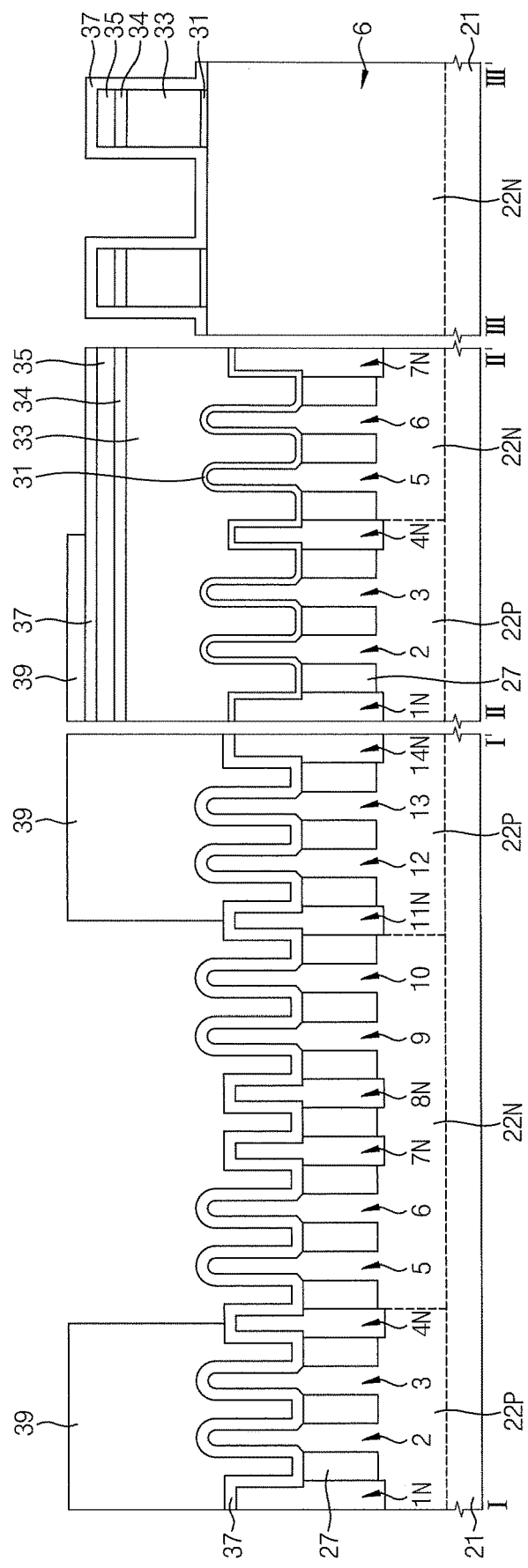

Referring to FIGS. 2 and 17, a fourth mask pattern 39 may be formed to cover the upper portion of the P-well 22P and to expose the upper portion of the N-well 22N. The fourth mask pattern 39 may include a photoresist pattern or a hard mask pattern. In some embodiments, the fourth mask pattern 39 may cover the first non-active fin 1N, the second active fin 2, the third active fin 3, the fourth non-active fin 4N, the eleventh non-active fin 11N, the twelfth active fin 12, the thirteenth active fin 13, and the fourteenth non-active fin 14N.

Figure 18:
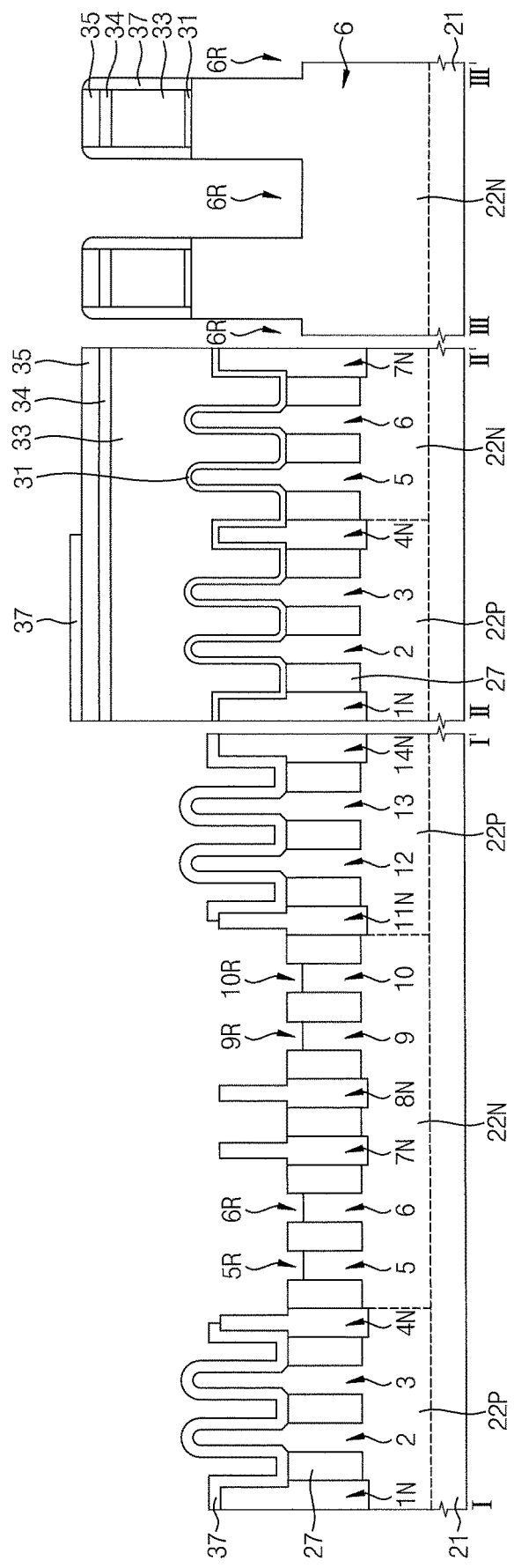

Referring to FIGS. 2 and 18, the spacer layer 37 may be partially removed using the fourth mask pattern 39 and the plurality of sacrificial gate patterns 31, 33, 34, and 35 as an etching mask, and thus, a plurality of recesses 5R, 6R, 9R, and 10R may be formed in the fifth active fin 5, the sixth active fin 6, the ninth active fin 9, and the tenth active fin 10. The process of forming the plurality of first recesses 5R, 6R, 9R, and 10R may be include an anisotropic etching process, an isotropic etching process, a directional etching process, or a combination thereof. The fourth mask pattern 39 may be removed. The spacer layer 37 may remain on side surfaces of the plurality of sacrificial gate patterns 31, 33, 34, and 35.

Bottoms of the plurality of first recesses 5R, 6R, 9R, and 10R may be formed on a level lower than that of upper surfaces of the device separating layer 27 adjacent thereto. The plurality of non-active fins 1N, 4N, 7N, 8N, 11N, and 14N may protrude to a level higher than those of the upper surfaces of the device separating layer 27 and the bottoms of the plurality of first recesses 5R, 6R, 9R, and 10R, which are adjacent thereto.

Figure 19:
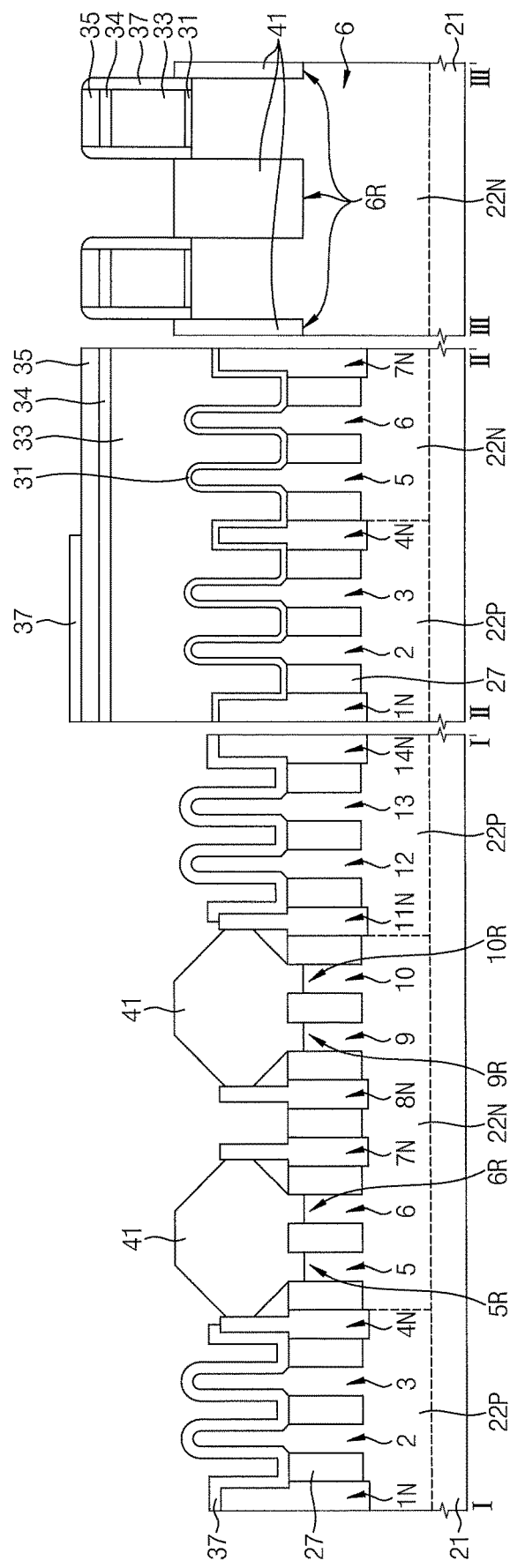

Referring to FIGS. 2 and 19, a plurality of first source/drain regions 41 may be formed in the plurality of first recesses 5R, 6R, 9R, and 10R. The process of forming the plurality of first source/drain regions 41 may include a selective epitaxial growth (SEG) process. In some embodiments, the plurality of first source/drain regions 41 may include a SiGe layer including P-type impurities.

Upper ends of the plurality of first source/drain regions 41 may protrude to a level higher than that of upper ends of the fifth active fin 5, the sixth active fin 6, the ninth active fin 9, and the tenth active fin 10. Each of the plurality of first source/drain regions 41 may have a shape in which a lateral width of a central region thereof is greater than a lateral width of an upper region and a lower region thereof. The side surfaces of the plurality of first source/drain regions 41 may be in contact with the side surfaces of the fourth non-active fin 4N, the seventh non-active fin 7N, the eighth non-active fin 8N, or the eleventh non-active fin 11N. The fourth non-active fin 4N, the seventh non-active fin 7N, the eighth non-active fin 8N, and the eleventh non-active fin 11N may restrict excessive lateral growth of the plurality of first source/drain regions 41.

Figure 20:
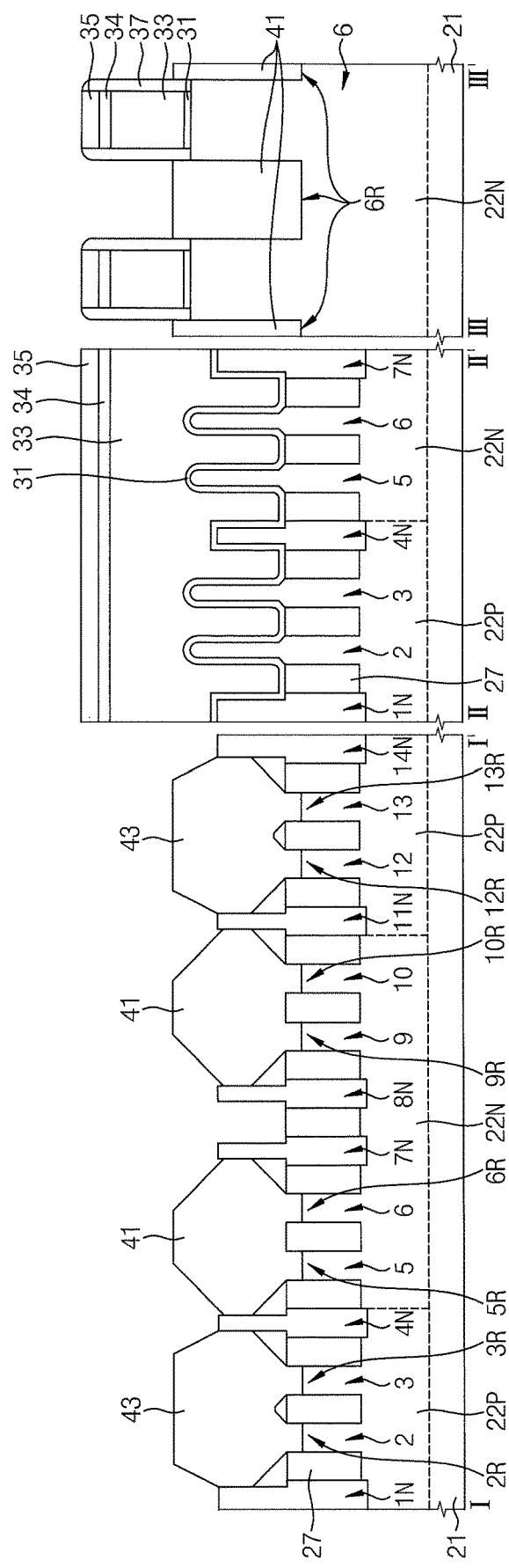

Referring to FIGS. 2 and 20, a plurality of second recesses 2R, 3R, 12R, and 13R may be formed in the second active fin 2, the third active fin 3, the twelfth active fin 12, and the thirteenth active fin 13 through a method similar to that described with reference to FIGS. 17 to 19. A plurality of second source/drain regions 43 may be formed in the plurality of second recesses 2R, 3R, 12R, and 13R. The process of forming the plurality of second recesses 2R, 3R, 12R, and 13R may include an SEG process. In some embodiments, the plurality of second source/drain regions 43 may include a SiC layer including N-type impurities or a Si layer including N-type impurities.

Upper ends of the plurality of second source/drain regions 43 may protrude to a level higher than that of upper ends of the second active fin 2, the third active fin 3, the twelfth active fin 12, and the thirteenth active fin 13. Each of the plurality of second source/drain regions 43 may have a different shape from each of the plurality of first source/drain regions 41. Each of the plurality of second source/drain regions 43 may have a shape in which a lateral width of a central region thereof is greater than a lateral width of an upper region and a lower region thereof. The side surfaces of the plurality of second source/drain regions 43 may be in contact with the side surfaces of the first non-active fin 1N, the fourth non-active fin 4N, the eleventh non-active fin 11N, or the fourteenth non-active fin 14N. The first non-active fin 1N, the fourth non-active fin 4N, the eleventh non-active fin 11N, and the fourteenth non-active fin 14N may restrict excessive lateral growth of the plurality of second source/drain regions 43.

Figure 21:
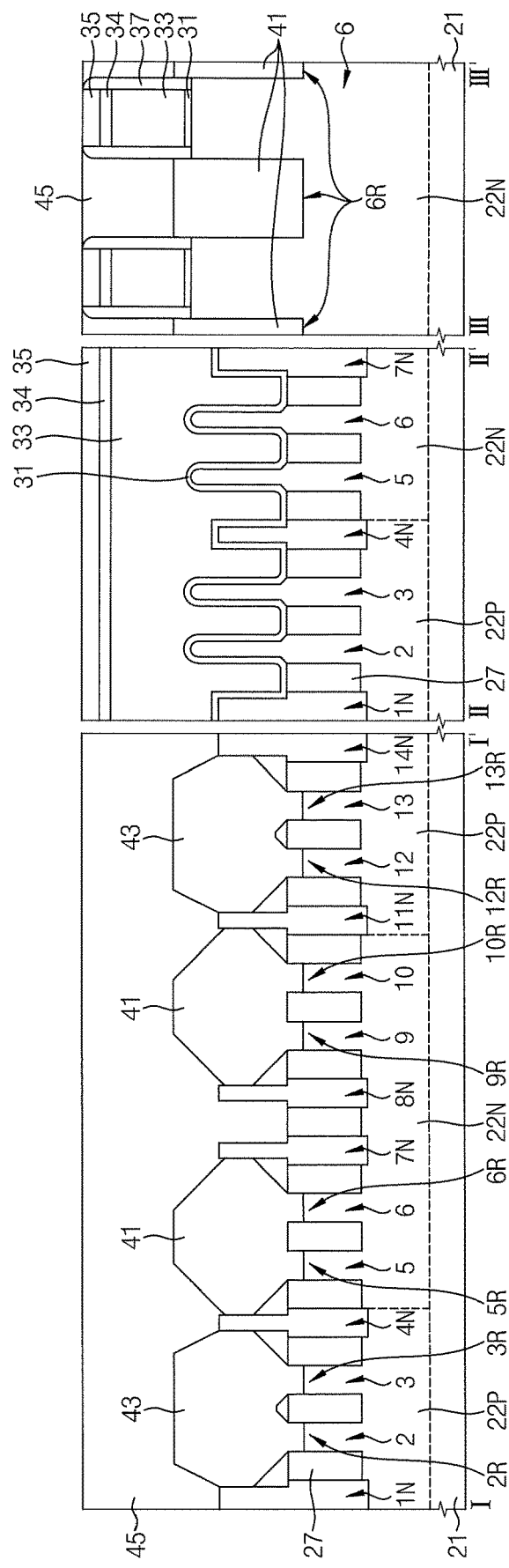

Referring to FIGS. 2 and 21, an interlayer insulating layer 45 may be formed on the plurality of first source/drain regions 41 and the plurality of second source/drain regions 43. The interlayer insulating layer 45 may include silicon oxide, silicon nitride, silicon oxynitride, silicon oxycarbonitride (SiOCN), low-K dielectrics, or a combination thereof. In some embodiments, the interlayer insulating layer 45 may include silicon oxide, and the plurality of non-active fins 1N, 4N, 7N, 8N, 11N, and 14N may include silicon nitride. The interlayer insulating layer 45 may include a multi-layered structure having a plurality of layers different from each other.

Figure 22:
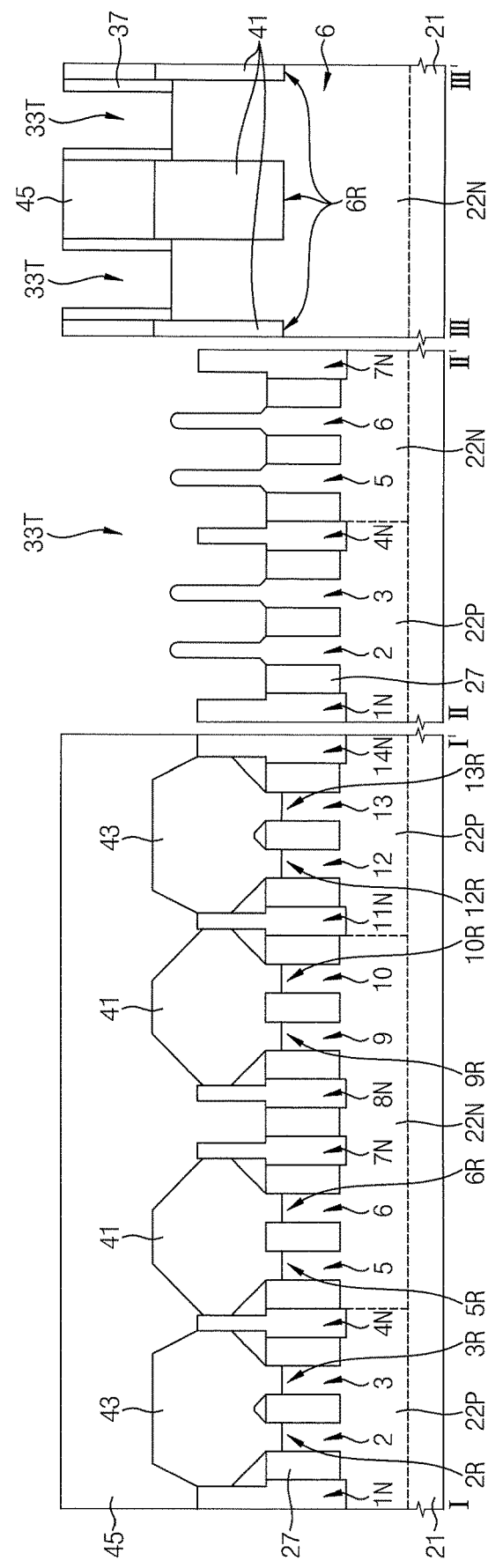

Referring to FIGS. 2 and 22, the plurality of sacrificial gate patterns 31, 33, 34, and 35 may be removed to form a plurality of gate trenches 33T. Upper surfaces and side surfaces of the plurality of fins 1N, 2, 3, 4N, 5, 6, 7N, 8N, 9, 10, 11N, 12, 13, and 14N may be exposed in the plurality of gate trenches 33T. The plurality of gate trenches 33T may be formed by a planarizing process and an etching process.

Figure 23:
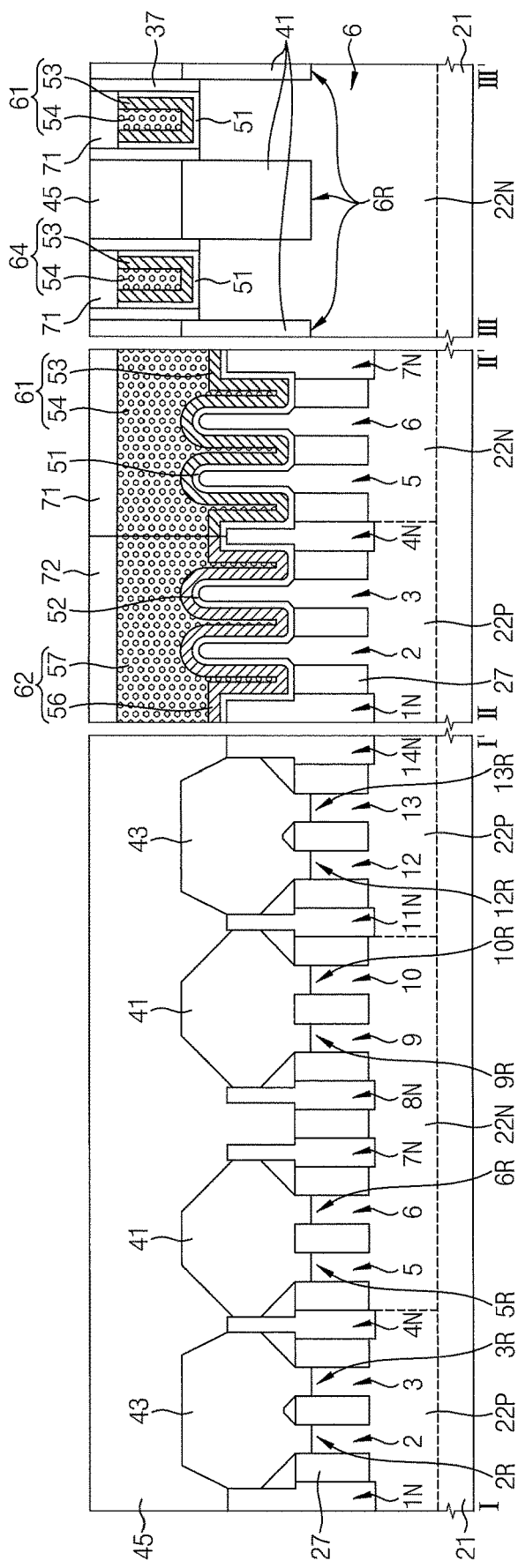

Referring to FIGS. 2 and 23, gate dielectric layers 51 and 52, the plurality of gate electrodes 61, 62, 63, 64, and 65, and gate capping layers 71 and 72 may be formed in the plurality of gate trenches 33T. The plurality of gate electrodes 61, 62, 63, 64, and 65 may include the first gate electrode 61, the second gate electrode 62, the third gate electrode 63, the fourth gate electrode 64, and the fifth gate electrode 65. The process of forming the gate dielectric layers 51 and 52, the plurality of gate electrodes 61, 62, 63, 64, and 65, and the gate capping layers 71 and 72 may include a plurality of thin film forming processes, a plurality of planarizing processes, and an etch-back process.

The gate dielectric layers 51 and 52 may include high-K dielectrics, silicon oxide, silicon nitride, silicon oxynitride, or a combination thereof. For example, the gate dielectric layers 51 and 52 may include HfO, HfSiO, AlO, or a combination thereof. The plurality of gate electrodes 61, 62, 63, 64, and 65 may include metal, metal nitride, metal oxide, metal silicide, conductive carbon, polysilicon, or a combination thereof. For example, the plurality of gate electrodes 61, 62, 63, 64, and 65 may include Ti, TiN, TiSiN, Ta, TaN, TaSiN, Zr, ZrN, Al, AlN, Ru, RuN, Mo, MoN, MoSiN, Co, CoN, CoSiN, W, WN, Ni, Si, or a combination thereof. The gate capping layers 71 and 72 may include silicon oxide, silicon nitride, silicon oxynitride, silicon oxycarbonitride (SiOCN), low-K dielectrics, or a combination thereof.

In some embodiments, each of the first gate electrode 61 and the fourth gate electrode 64 may include a first work-function conductive layer 53 and a first conductive layer 54. The second gate electrode 62 may include a second work-function conductive layer 56 and a second conductive layer 57. The first work-function conductive layer 53 may include a PMOS work-function metal, and the second work-function conductive layer 56 may include a NMOS work-function metal. Each of the first work-function conductive layer 53 and the second work-function conductive layer 56 may include a multi-layered structure. The first work-function conductive layer 53 and the second work-function conductive layer 56 may have different thicknesses from each other, but hereinafter, for convenience of description, the first work-function conductive layer 53 and the second work-function conductive layer 56 may have substantially the same thickness. The second conductive layer 57 may include a different material from the first conductive layer 54, or the first conductive layer 54 and the second conductive layer 57 may include the same material. The plurality of gate electrodes 61, 62, 63, 64, and 65 may correspond to a dual work-function metal gate. The plurality of gate electrodes 61, 62, 63, 64, and 65 may be referred to as replacement metal gates (RMG).

Figure 24:
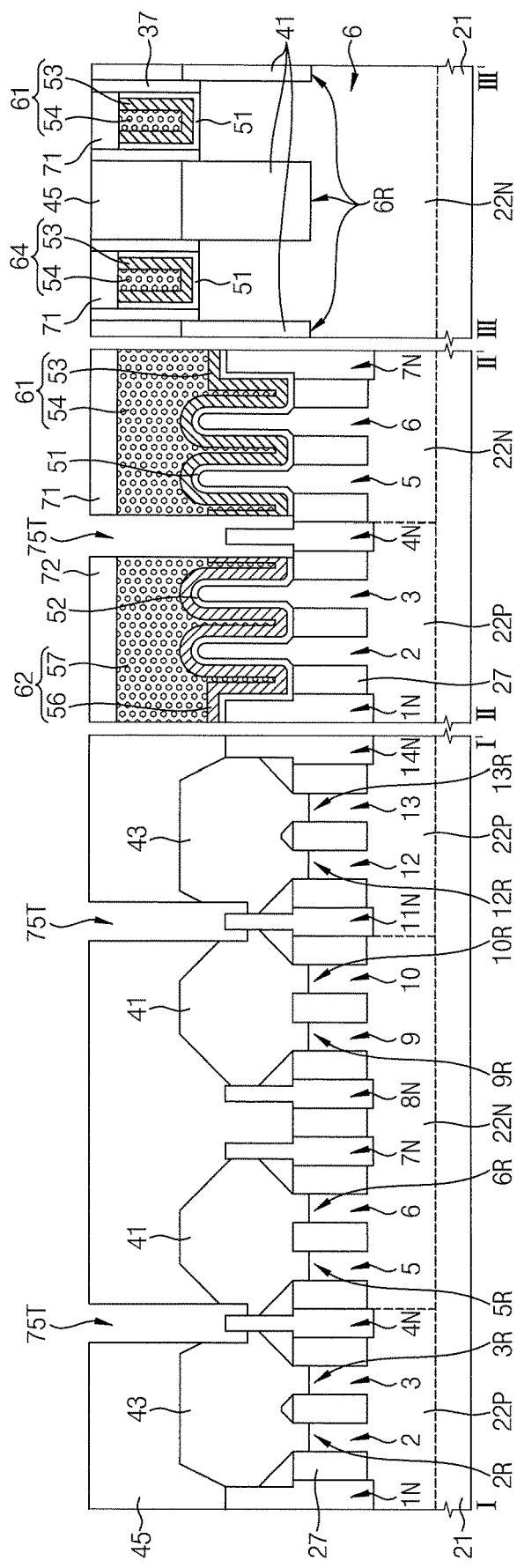

Referring to FIGS. 2 and 24, a plurality of separation trenches 75T passing through the gate capping layers 71 and 72 and the plurality of gate electrodes 61, 62, 63, 64, and 65 may be formed. The process of forming the separation trenches 75T may include a patterning process. The plurality of separation trenches 75T may separate the plurality of gate electrodes 61, 62, 63, 64, and 65 from each other. Bottoms of the plurality of separation trenches 75T may be formed at a level lower than that of the upper ends of the plurality of non-active fins 1N, 4N, 7N, 8N, 11N, and 14N.

In some embodiments, one of the separation trenches 75T may overlap the fourth non-active fin 4N, and another one of the separation trenches 75T may overlap the eleventh non-active fin 11N. The upper surfaces and side surfaces of the fourth non-active fin 4N and the eleventh non-active fin 11N may be exposed in the plurality of separation trenches 75T.

Referring again to FIGS. 1 and 2, the plurality of gate separating patterns 75 may be formed in the plurality of separation trenches 75T. The plurality of gate separation trenches 75T may be formed through a thin film forming process and a planarizing process. The plurality of gate separating patterns 75 may include silicon oxide, silicon nitride, silicon oxynitride, silicon oxycarbonitride (SiOCN), low-K dielectrics, or a combination thereof.

Figure 25:
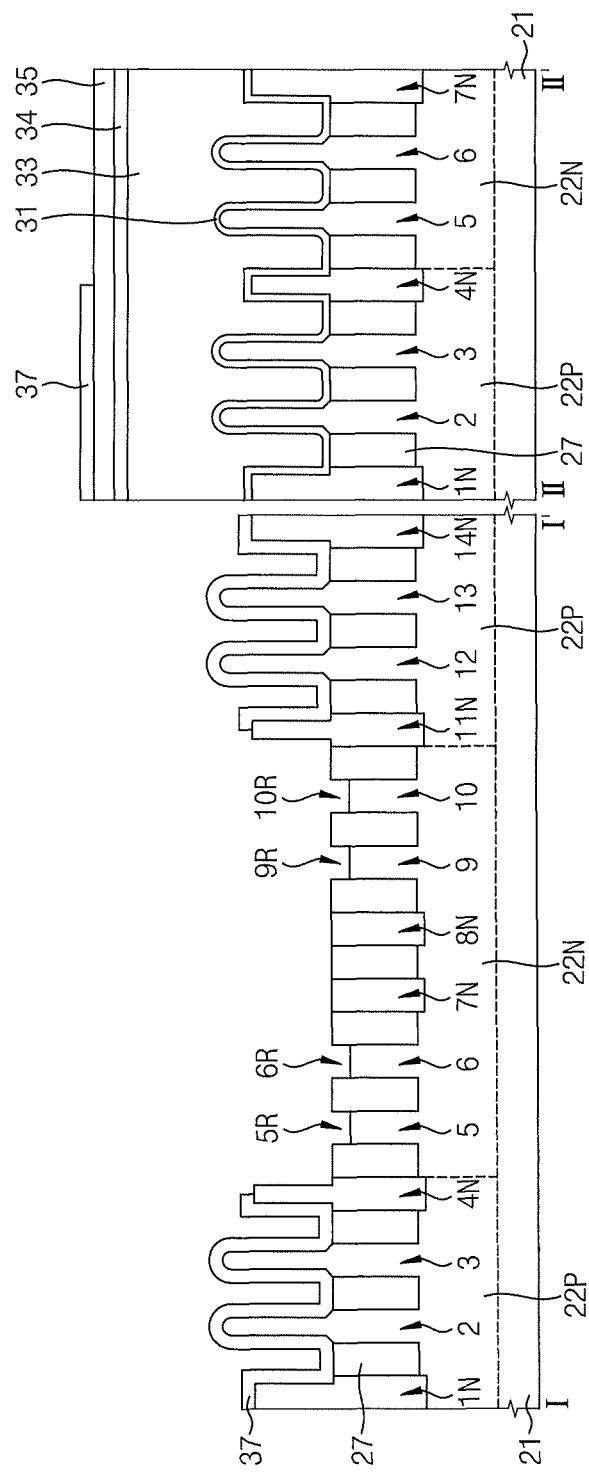
Figure 26:
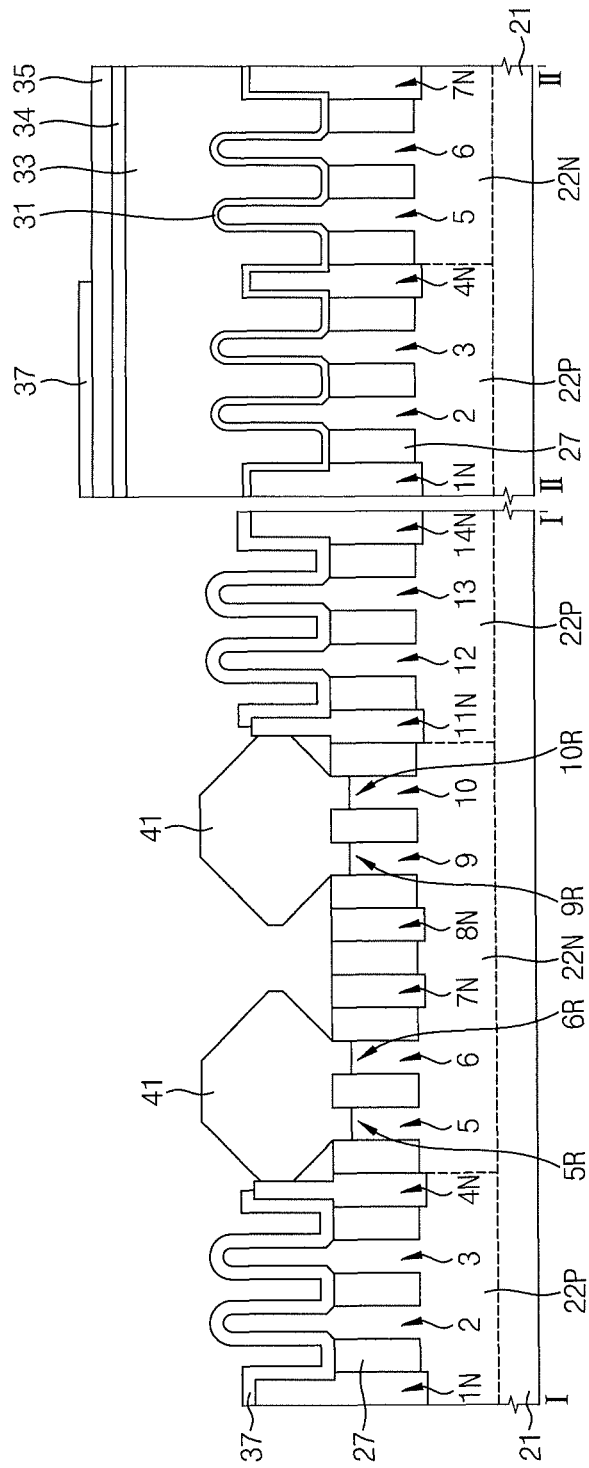

FIGS. 25 and 26 are cross-sectional views illustrating operations for manufacturing a semiconductor device according to some embodiments. Referring to FIG. 25, upper surfaces of a seventh non-active fin 7N and an eighth non-active fin 8N may be formed at substantially the same level as an upper surface of the device separating layer 27 adjacent thereto. The upper surfaces of the seventh non-active fin 7N, the eighth non-active fin 8N, and the device separating layer 27 may be formed at a level higher than that of bottoms of the plurality of first recesses 5R, 6R, 9R, and 10R. The upper surfaces of the seventh non-active fin 7N and the eighth non-active fin 8N may be formed at a level lower than that of the upper surfaces of a fourth non-active fin 4N and an eleventh non-active fin 11N which are adjacent thereto.

Referring to FIG. 26, a plurality of first source/drain regions 41 may be formed in the plurality of first recesses 5R, 6R, 9R, and 10R disposed in the fifth active fin 5, the sixth active fin 6, the ninth active fin 9, and the tenth active fin 10. One side surfaces of the plurality of first source/drain regions 41 may be in contact with a side surface of the fourth non-active fin 4N or a side surface of the eleventh non-active fin 11N. The other side surfaces of the plurality of first source/drain regions 41 may overlap an upper portion of the seventh non-active fin 7N or an upper portion of the eighth non-active fin 8N.

Figure 27:
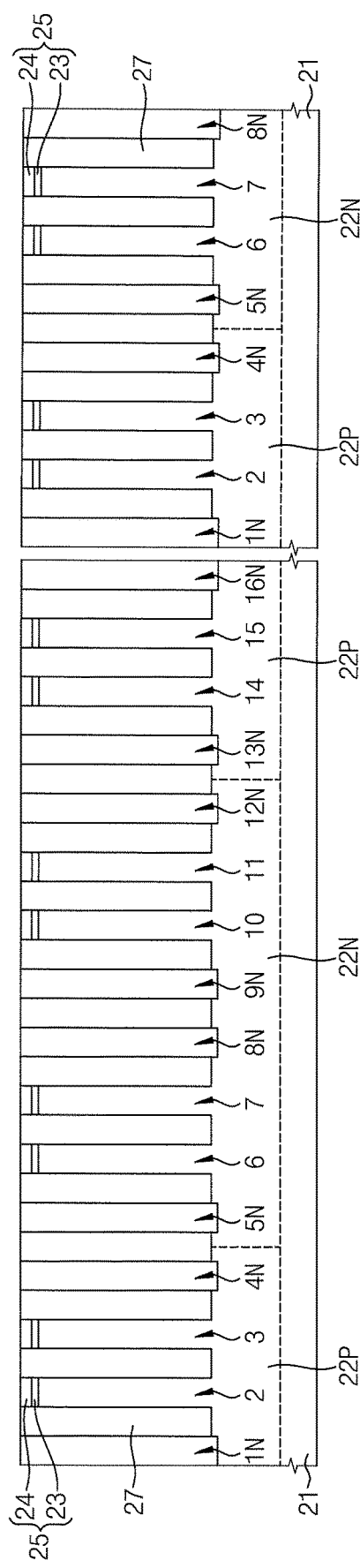
Figure 28:
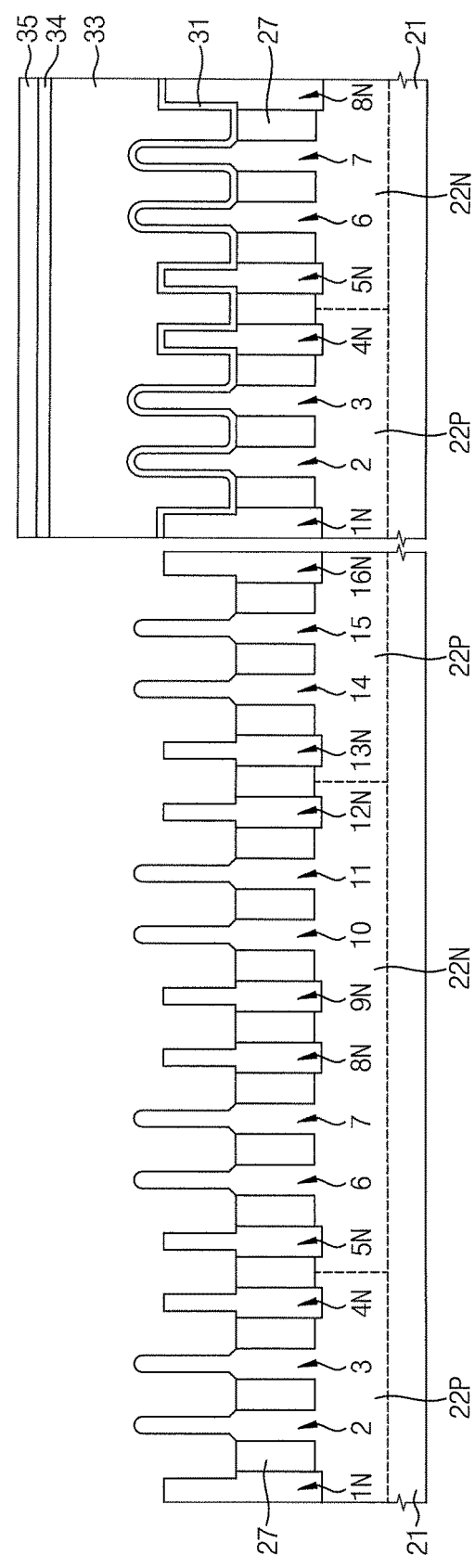

FIGS. 27 and 28 are cross-sectional views illustrating operations for manufacturing a semiconductor device according to an exemplary embodiment. Referring to FIG. 27, a plurality of fins 1N, 2, 3, 4N, 5N, 6, 7, 8N, 9N, 10, 11, 12N, 13N, 14, 15, and 16N may include a first non-active fin 1N, a second active fin 2, a third active fin 3, a fourth non-active fin 4N, a fifth non-active fin 5N, a sixth active fin 6, a seventh active fin 7, an eighth non-active fin 8N, a ninth non-active fin 9N, a tenth active fin 10, an eleventh active fin 11, a twelfth non-active fin 12N, a thirteenth non-active fin 13N, a fourteenth active fin 14, a fifteenth active fin 15, and a sixteenth non-active fin 16N. The fourth non-active fin 4N and the fifth non-active fin 5N may be interposed between the third active fin 3 and the sixth active fin 6, and the twelfth non-active fin 12N and the thirteenth non-active fin 13N may be interposed between the eleventh active fin 11 and the fourteenth active fin 14. Referring to FIG. 28, sacrificial gate patterns 31, 33, 34, and 35 that cross the plurality of fins 1N, 2, 3, 4N, 5N, 6, 7, 8N, 9N, 10, 11, 12N, 13N, 14, 15, and 16N may be formed.

Figure 29:
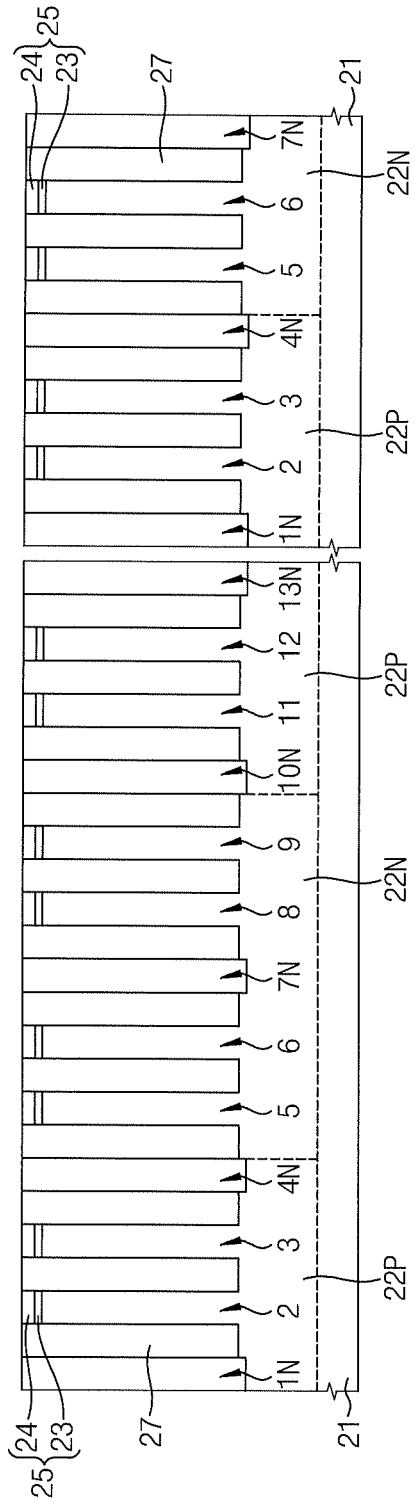
Figure 30:
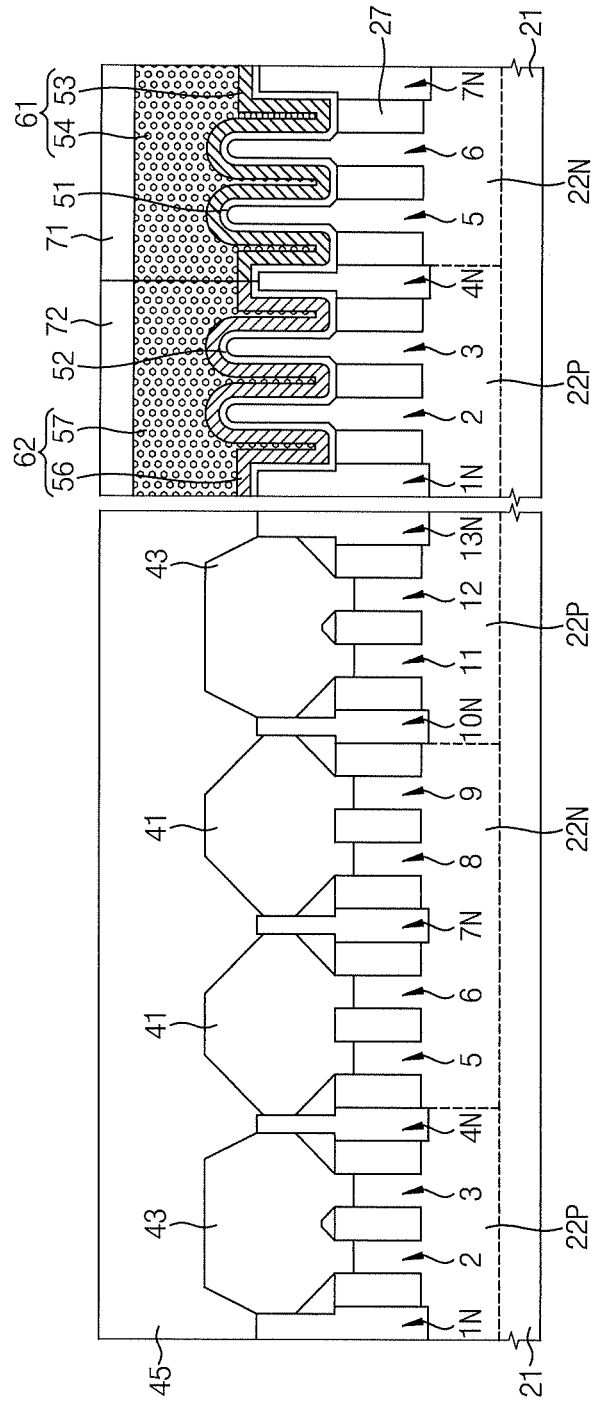

FIGS. 29 and 30 are cross-sectional views illustrating operations for manufacturing a semiconductor device according to some embodiments. Referring to FIG. 29, a plurality of fins 1N, 2, 3, 4N, 5, 6, 7N, 8, 9, 10N, 11, 12, and 13N may include a first non-active fin 1N, a second active fin 2, a third active fin 3, a fourth non-active fin 4N, a fifth active fin 5, a sixth active fin 6, a seventh non-active fin 7N, an eighth active fin 8, a ninth active fin 9, a tenth non-active fin 10N, an eleventh active fin 11, a twelfth active fin 12, and a thirteenth non-active fin 13N. The seventh non-active fin 7N may be interposed between the sixth active fin 6 and the eighth active fin 8.

Referring to FIG. 30, a plurality of first source/drain regions 41, a plurality of second source/drain regions 43, an interlayer insulating layer 45, gate dielectric layers 51 and 52, a plurality of gate electrodes 61 and 62, and gate capping layers 71 and 72 may be formed.

According to the exemplary embodiments, gate separating patterns arranged on a non-active fin between a plurality of active fins, a plurality of source/drain regions, and the non-active fin are provided. The non-active fin can serve to reduce a stress caused by non-uniform intervals between the active fins and to minimize process variation. The non-active fin can serve to restrict excessive lateral growth in the source/drain regions. The non-active fin and the gate separating pattern can block a leakage current from being generated between the gate electrodes. Thus, a semiconductor device having a minimized leakage current and high operation characteristics can be realized.

While the embodiments of the present inventive concept have been described with reference to the accompanying drawings, it should be understood by those skilled in the art that various modifications may be made without departing from the scope of the present inventive concept and without changing essential features thereof. Therefore, the above-described embodiments should be considered in a descriptive sense only and not for purposes of limitation.

What is claimed is:

1. A semiconductor device comprising:
a substrate having a plurality of fins protruding therefrom, the plurality of fins comprising a plurality of active fins and at least one non-active fin disposed between ones of the plurality of active fins;
at least one gate electrode crossing at least a portion of the active fins;
a plurality of source/drain regions disposed on the active fins adjacent the at least one gate electrode and separated from one another by the at least one non-active fin; and
a gate separating pattern interposed between first and second gate electrodes of the at least one gate electrode,
wherein a lowermost surface of the gate separating pattern directly contacts a source/drain region of the plurality of source/drain regions.

2. The semiconductor device of claim 1, wherein the plurality of fins have a substantially uniform same pitch.

3. The semiconductor device of claim 1, wherein intervals between adjacent ones of the plurality of fins are substantially the same.

4. The semiconductor device of claim 1, wherein an uppermost end of the non-active fin is disposed at a level higher than that of a lowermost end of the plurality of source/drain regions.

5. The semiconductor device of claim 1, wherein an uppermost end of the at least one non-active fin is disposed on a level lower than uppermost ends of the plurality of active fins.

6. The semiconductor device of claim 1, wherein an uppermost end of the at least one non-active fin is disposed on a level higher than that of lowermost end of the at least one gate electrode.

7. The semiconductor device of claim 1, wherein side surfaces of the plurality of source/drain regions are in contact with side surfaces of the at least one non-active fin.

8. The semiconductor device of claim 1, further comprising a device separating layer between the ones of the plurality of fins and comprising a different material than the at least one non-active fin.

9. The semiconductor device of claim 8, wherein an upper end of the at least one non-active fin is disposed at a level higher than that of an upper end of the device separating layer.

10. The semiconductor device of claim 1, wherein the first and second gate electrodes are co-linear.

11. The semiconductor device of claim 10, wherein the gate separating pattern is in contact with upper and side surfaces of the non-active fin.

12. The semiconductor device of claim 10, wherein a lower end of the gate separating pattern is disposed at a level lower than an upper end of the non-active fin.

13. The semiconductor device of claim 10:
wherein the first and second gate electrodes partially extend to a lower portion of the gate separating pattern; and
wherein a lower surface of the gate separating pattern is in contact with the first and second gate electrodes.

14. The semiconductor device of claim 1, wherein the at least one non-active fin includes a different material than a material of the plurality of active fins, and
wherein the at least one non-active fin includes an insulating layer including silicon nitride, silicon oxide, SiC, SiOC, polysilicon, or a combination thereof.

15. A semiconductor device comprising:
a substrate having a plurality of fins protruding therefrom, the plurality of fins comprising a plurality of active fins and at least one non-active fin disposed between ones of the plurality of active fins;
at least one gate electrode crossing at least a portion of the active fins;
a plurality of source/drain regions disposed on the active fins adjacent the at least one gate electrode and separated from one another by the at least one non-active fin; and
a device separating layer between the ones of the plurality of fins and comprising a different material than the at least one non-active fin,
wherein a lower end of the at least one non-active fin is disposed at a level lower than that of a lower end of the device separating layer.

16. A semiconductor device comprising:
a substrate having a P-well and an N-well therein;
a P-type active fin disposed in the P-well;
an N-type active fin disposed in the N-well;
a first gate electrode crossing the N-type active fin;
a second gate electrode crossing the P-type active fin;
a first source/drain region disposed on the N-type active fin;
a second source/drain region disposed on the P-type active fin;
at least one non-active fin disposed between the P-type active fin and the N-type active fin and between the first source/drain region and the second source/drain region; and
a gate separating pattern interposed between the first and second gate electrodes,
wherein a lowermost surface of the gate separating pattern directly contacts at least one of the first source/drain region and the second source/drain region.

17. The semiconductor device of claim 16, wherein the at least one non-active fin is adjacent an interface between the P-well and the N-well.

18. The semiconductor device of claim 16, wherein the at least one non-active fin comprises first and second non-active fins in the P-well and the N-well, respectively.

19. The semiconductor device of claim 18, wherein an upper surface of the second non-active fin is disposed at a level lower than that of an upper surface of the first non-active fin.

20. A semiconductor device comprising:
a first active fin disposed in a substrate;
a second active fin disposed in the substrate and spaced apart from the first active fin;
a non-active fin disposed between the first active fin and the second active fin;
a first gate electrode crossing the first active fin;
a second gate electrode crossing the second active fin;
a first source/drain region disposed on the first active fin;
a second source/drain region disposed on the second active fin; and
a gate separating pattern disposed on the non-active fin between the first gate electrode and the second gate electrode,
wherein a lowermost surface of the gate separating pattern directly contacts at least one of the first source/drain region and the second source/drain region.

* * * * *